US006621680B1

(12) United States Patent
Segervall

(10) Patent No.: US 6,621,680 B1
(45) Date of Patent: Sep. 16, 2003

(54) 5V TOLERANT CORNER CLAMP WITH KEEP OFF CIRCUIT AND FULLY DISTRIBUTED SLAVE ESD CLAMPS FORMED UNDER THE BOND PADS

(75) Inventor: Alan Erik Segervall, Half Moon Bay, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/137,066

(22) Filed: May 2, 2002

Related U.S. Application Data

(63) Continuation-in-part of application No. 10/006,602, filed on Dec. 5, 2001.

(51) Int. Cl.[7] .............................................. H05K 5/00
(52) U.S. Cl. ..................................................... 361/111
(58) Field of Search ................................. 361/111, 760, 361/772, 54, 56; 257/678, 690, 691, 692

(56) References Cited

U.S. PATENT DOCUMENTS

| 5,239,440 | A | | 8/1993 | Merrill | .......................... | 361/56 |
|---|---|---|---|---|---|---|
| 5,838,146 | A | * | 11/1998 | Singer | .......................... | 361/56 |
| 6,104,588 | A | | 8/2000 | Hariton et al. | .............. | 361/111 |
| 6,400,540 | B1 | * | 6/2002 | Chang | .......................... | 361/56 |
| 6,538,868 | B2 | * | 3/2003 | Chang et al. | ................ | 361/111 |

* cited by examiner

Primary Examiner—Edward H. Tso
Assistant Examiner—Pia Tibbits
(74) Attorney, Agent, or Firm—Mark C. Pickering

(57) ABSTRACT

The pads of a semiconductor die are protected from an electrostatic discharge (ESD) event by an ESD protection circuit that has a number of master clamps and a number of slave clamps that are controlled by the master clamps. The slave clamps are formed under the ESD plus and minus rings which, in turn, are formed under the pads, thereby providing a significant reduction in the height of the I/O cell, and improved ESD performance by reducing metalization IR drops. The master and slave clamps provide 5V tolerance by utilizing a keep off circuit that prevents the master clamp from triggering when the voltage on the positive ESD rail changes from a first non-ESD voltage to a second non-ESD voltage.

20 Claims, 16 Drawing Sheets

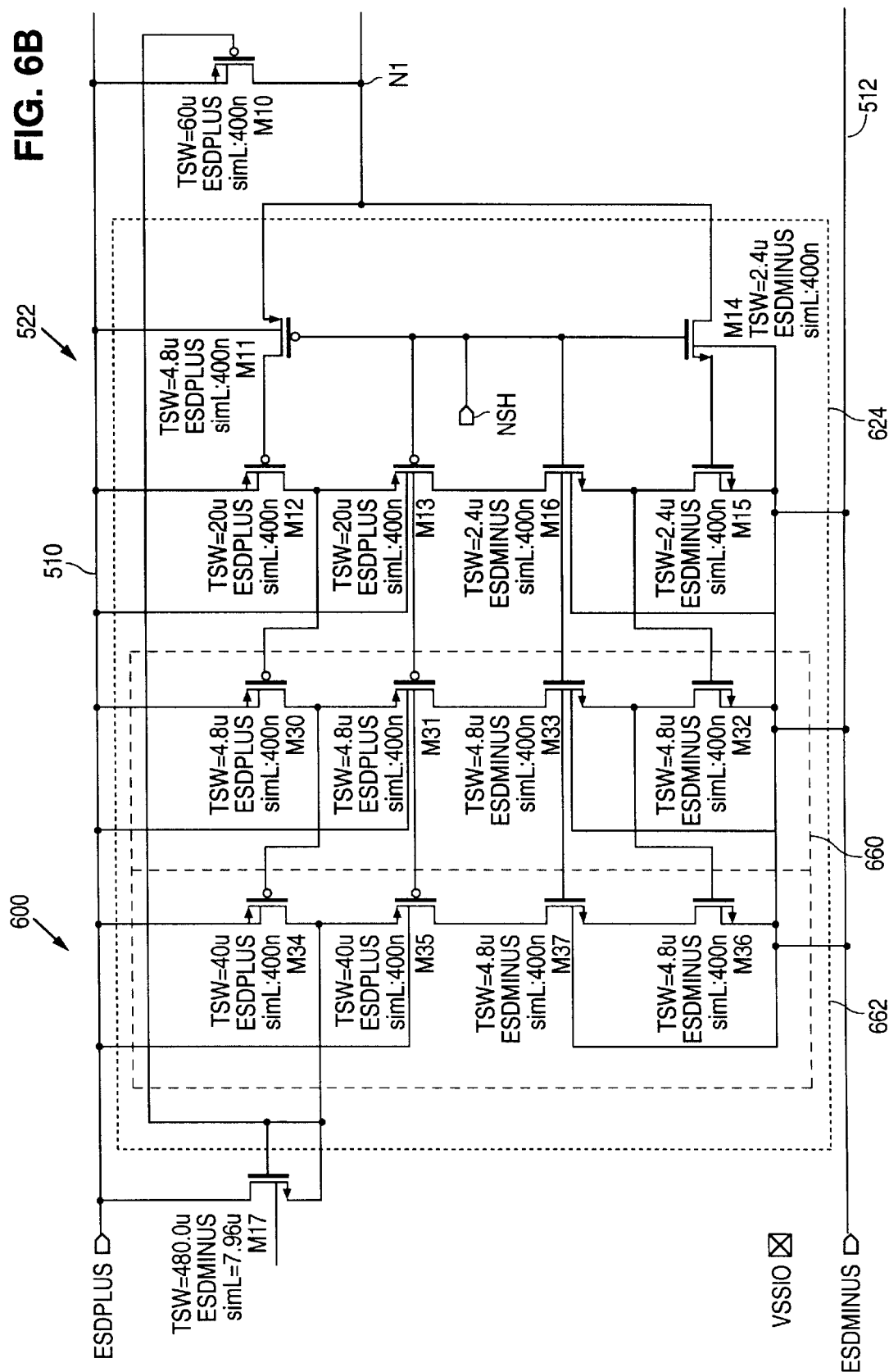

US 6,621,680 B1

5V TOLERANT CORNER CLAMP WITH KEEP OFF CIRCUIT AND FULLY DISTRIBUTED SLAVE ESD CLAMPS FORMED UNDER THE BOND PADS

RELATED INVENTIONS

The present invention is a Continuation-in-Part of application Ser. No. 10/006,602 filed on Dec. 5, 2001 for 5V TOLERANT CORNER CLAMP WITH KEEP OFF CIRCUIT by Alan E. Segervall.

BACKGROUND OF THE INVENTION

1. Field of the Invention

The present invention relates to an ESD circuit and, more particularly, to a 5V tolerant corner clamp with a keep off circuit and a fully distributed slave ESD clamps formed under the bond pads.

2. Description of the Related Art

An electrostatic discharge (ESD) protection circuit is a circuit that protects the input/output transistors of a semiconductor chip from an ESD event. An ESD event typically occurs when the chip is exposed to static electricity, such as when the pins or solder bumps of the chip are touched by an ungrounded person handling the chip, or when the chip slides across another surface on its pins or solder bumps.

For example, an ungrounded person handling a semiconductor chip can place a static electric charge as high as 2000V on the chip. This voltage is more than sufficient to destructively break down the gate oxide of the input/output transistors of the chip.

FIG. 1 shows a schematic diagram that illustrates a prior-art ESD protection circuit 100. As shown in FIG. 1, circuit 100 includes an ESD plus ring 110 and an ESD minus ring 112 that are formed around the periphery of a semiconductor die 114. In addition, circuit 100 includes a power pad 120, a ground pad 122, and a number of input/output (I/O) pads 124.

As further shown in FIG. 1, circuit 100 includes a plurality of upper diodes D1 that are connected to ESD plus ring 110 and the pads 120, 122, and 124 so that each pad is connected to ESD plus ring 110 via a diode D1. In addition, a plurality of lower diodes D2 are connected to ESD minus ring 112 and the pads 120, 122, and 124 so that each pad is connected to ESD minus ring 112 via a diode D2. Circuit 100 also includes four corner clamps 130 that are connected to ESD plus ring 110 and ESD minus ring 112.

In operation, when an ESD event occurs, a first pad, such as pad A, is zapped positively with respect to a second pad, such as pad B. In this situation, a zap current $I_{ZAP}$ flows from the first pad through the adjacent diode D1 to ESD plus ring 110, and then on to corner clamps 130.

Corner clamps 130 are voltage controlled switches that each provide a low impedance pathway from ESD positive ring 110 to ESD negative ring 112 when an ESD event is present, and a high impedance pathway between rings 110 and 112 when an ESD event is not present.

When the first pad is zapped, the corner clamps 130 (which are shown open, not closed, in FIG. 1) close and the zap current $I_{ZAP}$ flows through clamps 130 to ESD minus ring 112. From ring 112, the zap current $I_{ZAP}$ flows through a diode D2 and on to the second pad.

FIG. 2 shows a schematic diagram that illustrates corner clamp 130. As shown in FIG. 2, clamp 130 includes a RC timing circuit 210, an inverter 212, and a switching transistor M1. Timing circuit 210, in turn, includes a resistor R that is connected to ESD plus ring 110, and a capacitor C that is connected to resistor R and ESD minus ring 112.

Inverter 212 includes a PMOS transistor M2 and a NMOS transistor M3. Transistor M2 has a source connected to ESD plus ring 110, a gate connected to resistor R and capacitor C, and a drain. Transistor M3 has a source connected to ESD minus ring 112, a gate connected to resistor R and capacitor C, and a drain connected to the drain of transistor M2. Further, switching transistor M1 has a source connected to ESD minus ring 112, a gate connected to the drains of transistors M2 and M3, and a drain connected to ESD plus ring 110.

In operation, when an ESD event occurs and the zap current $I_{ZAP}$ flows onto ESD plus ring 110, the voltage on ESD plus ring 110 spikes up dramatically. The voltage on the gates of transistors M2 and M3 also spikes up but, due to the presence of RC timing circuit 110, the gate voltage lags the voltage on ESD plus ring 110.

As a result, the gate-to-source voltage of transistor M2 falls below the threshold voltage of transistor M2, thereby turning on transistor M2 for as long as the gate voltage lags the voltage on ring 110. When transistor M2 turns on, transistor M2 pulls up the voltage on the gate of transistor M1, thereby turning on transistor M1. When transistor M1 is turned on, clamp 130 provides a low impedance pathway from ESD plus ring 110 to ESD minus ring 112.

Once the packaged integrated circuit has been attached to a circuit board, power has been applied to the integrated circuit, and a steady state condition has been reached, a first voltage is present on both ESD plus ring 110 and the gates of transistors M2 and M3. For example, when pad 120 is a 3.3V power pad, a first voltage of 2.6V is present on ESD plus ring 110 due to the diode drop of adjacent diode D1. In addition, a second voltage is present on ESD minus ring 112. For example, since pad 122 is ground, a second voltage of 0.7V is present on ESD minus ring 112 due to the diode drop of adjacent diode D2.

Since the first voltage is present on the gates of transistors M2 and M3, transistor M2 is turned off and transistor M3 is turned on. When turned on, transistor M3 pulls down the voltage on the gate of transistor M1, thereby turning off transistor M1. When transistor M1 is turned off, clamp 130 provides a high impedance pathway from ESD plus ring 110 to ESD minus ring 112.

One problem with clamp 130 is that clamp 130 falsely triggers when used with a 5V tolerant circuit. A 5V tolerant circuit is a circuit that internally utilizes a voltage less than 5V, such as 3.3V, but receives 5V signals. For example, I/O pad C in FIG. 1 can be driven by an external driver that outputs signals ranging from zero to 5V.

When 5V signals are driven onto a signal pad, such as pad C, the voltage on ESD plus ring 110 spikes up from 2.6V to 4.3V (a diode drop less than 5V). In addition, when a large number of pads are driven to 5V at the same time, such as when the 64 pads of a PCI bus are simultaneously driven high, the voltage on ESD plus ring 110 can spike up to 4.8V.

Due to the timing lag provided by RC timing circuit 210, the spike in voltage, a delta of 1.7V to 2.2V, causes the gate-to-source voltage of transistor M2 to again fall below the threshold voltage, thereby turning on transistor M2. When transistor M2 turns on, transistor M2 pulls up the voltage on the gate of transistor M1, thereby turning on transistor M1.

Since transistor M1 turned on in response to a 5V signal rather than in response to an ESD event, clamp 130 was falsely triggered. Falsely triggering clamp 130 increases power dissipation and significantly loads the external device that is driving the signal pad.

The ESD protection circuitry used on a semiconductor chip is commonly considered to be part of the I/O cell structure of the chip. Typically, each I/O cell includes a pad, such as power pad 120, ground pad 122, or an I/O pad 124, a section of an ESD plus ring, such as ring 110, and a section of an ESD minus ring, such as ring 112.

In addition, each I/O cell includes an upper diode, such as diode D1, that is connected between the pad and the ESD plus ring, and a lower diode, such as diode D2, that is connected between the pad and the ESD minus ring. Further, each I/O cell includes a section of a clean power ring, and a section of a clean ground ring. The clean power ring, which is supplied by a first power pad, and the clean ground ring, which is connected to a first ground pad, support the core circuitry of the semiconductor chip with substantially noise free power and ground connections.

Each I/O cell also includes a section of a dirty power ring, and a section of a dirty ground ring. The dirty power ring, which is supplied by a second power pad, and the dirty ground ring, which is connected to a second ground pad, support the noisy I/O circuits. In addition, each I/O cell typically includes I/O circuitry.

FIGS. 3A–3F show a series of plan views that illustrate an example of the physical layout of a prior art I/O cell 300. As shown in FIG. 3A, I/O cell 300, which is formed in a layer of semiconductor material 302, includes a diode 304, such as diode D1 of FIG. 1, that is formed in material 302. In addition, I/O cell 300 includes a diode 306, such as diode D2 of FIG. 1, that is formed in material 302.

Further, I/O cell 300 includes I/O circuitry 312 that is formed in semiconductor material 302. I/O circuitry 312 can include, for example, MOS and/or bipolar transistors. Cell 300 also includes a number of contacts 314 that are formed through a first layer of dielectric material to make an electrical connection with diodes 304 and 306 and I/O circuitry 312.

Referring to FIG. 3B, I/O cell 300 additionally includes a first pad P1 and a number of first regions 316 that are formed from a first layer of metal. Pad P1 and the first regions 316, which include first regions 316A and 316B, are formed so that pad P1 and the first regions 316 make electrical connections with contacts 314. Cell 300 also includes a number of vias 320 that are formed through a second layer of dielectric material to make electrical connections with pad P1 and the first regions 316.

Referring to FIG. 3C, I/O cell 300 additionally includes a second pad P2 and a number of second regions 322 that are formed from a second layer of metal. Pad P2 and the second regions 322, which include second regions 322-A, 322-B, and 322-C, are formed so that pad P2 and the second regions 322 make electrical connections with vias 320.

Cell 300 also includes a trace 324 that is formed from the second layer of metal. Trace 324 is connected to pad P2, second region 322-A, and second region 322-C. Cell 300 also includes a number of vias 330 that are formed through a third layer of dielectric material to make electrical connections with pad P2 and the second regions 322.

Referring to FIG. 3D, I/O cell 300 further includes a third pad P3, a section of a first ESD plus ring 340, and a section of a first ESD minus ring 342. In addition, I/O cell 300 includes a section of clean power line 344, and a section of a clean ground line 346. Further, I/O cell 300 includes a section of a dirty power line 350, and a section of a dirty ground line 352. Pad P3, rings 340 and 342, and lines 344, 346, 350, and 352 are formed from a third layer of metal.

Pad P3, rings 340 and 342, and lines 344, 346, 350, and 352 are also formed to make electrical connections with vias 330. Cell 300 additionally includes a number of vias 354 that are formed through a fourth layer of dielectric material to make electrical connections with pad P3, rings 340 and 342, and lines 344, 346, 350, and 352.

Referring to FIG. 3E, I/O cell 300 additionally includes a fourth pad P4, a second ESD plus ring 360, and a second ESD minus ring 362. In addition, I/O cell 300 includes a clean power line 364, a clean ground line 366, a dirty power line 370, and a dirty ground line 372. Pad P4, =rings 360 and 362, and lines 364, 366, 370, and 372 are formed from a fourth layer of metal.

Pad P4, rings 360 and 362, and lines 364, 366, 370, and 372 are also formed to make electrical connections with vias 354. Cell 300 also includes a number of vias 374 that are formed through a fifth layer of dielectric material to make electrical connections with pad P4, rings 360 and 362, and lines 364, 366, 370, and 372.

Referring to FIG. 3F, I/O cell 300 further includes a fifth pad P5, a third ESD plus ring 380, and a third ESD minus ring 382. In addition, I/O cell 300 includes a clean power line 384, a clean ground line 386, a dirty power line 390, and a dirty ground line 392. Pad P5, rings 380 and 382, and lines 384, 386, 390, and 392 are formed from a fifth layer of metal. Pad P5, rings 380 and 382, and lines 384, 386, 390, and 392 are also formed to make electrical connections with vias 374.

Together, pads P1–P5 form a bonding pad, such as pad 120 of FIG. 1. Together, ESD plus rings 340, 360, and 380 form an ESD plus ring, such as ring 110. Together, ESD minus rings 342, 362, and 382 form an ESD minus ring, such as ring 112.

As further shown in FIG. 3F, I/O cell 300 has an I/O cell height X that is measured laterally from the edge of the die and includes the widths of pad P5, rings 380 and 382, and lines 384, 386, 390, and 392. Pad P5, the pair of rings 380 and 382, the pair of lines 384 and 386, and the pair of lines 390 and 392 each require about the same amount of silicon real estate.

In operation, when an ESD event occurs on pad P5, the voltage spike passes through vias 374 to pad P4, and from pad P4 through vias 354 to pad P3. The voltage spike continues through vias 330 to pad P2, and from pad P2 through trace 324 to region 322A. The spike continues through vias 320 to region 316A, and from region 316A through contact 314 to diode D1.

The voltage spike passes through diode D1, through contact 314 to region 316-B, and from region 316-B to via 320, and then to region 322-B. From region 322-B, the spike continues to via 330, and then to ESD plus ring 340. From ESD plus ring 340, the spike moves to ESD plus rings 360 and 380 by vias 354 and 374.

Although ESD protection circuit 100 functions satisfactorily, there is a need for alternate ESD protection circuits and layouts.

SUMMARY OF THE INVENTION

The present invention provides an ESD protection circuit that includes a number of 5V tolerant ESD master and slave clamps that do not falsely trigger when a 5V signal is driven onto a signal pad. The ESD circuit, which is formed on a semiconductor die, has an ESD plus ring and an ESD minus ring that are formed on the die around the periphery of the die.

The ESD circuit also has first and second trigger rings that are formed on the die around the periphery of the die, and a plurality of first clamps formed on the die. Each first clamp has first and second diodes that are formed on the die. The first diode is connected to a pad and the ESD plus ring. The second diode is connected to the pad and the ESD minus ring.

The ESD circuit further has a first transistor that is connected to the ESD plus ring, the first trigger ring, and a first node, and a second transistor that is connected to the first node, the second trigger ring, and a second node. In addition, a third transistor is connected to the ESD minus ring, the second trigger ring, and the second node, a fourth transistor is connected to the ESD plus ring, the first node, and a third node, and a fifth transistor is connected to the second node, the third node, and the ESD minus ring.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 6A–6B are circuit diagrams illustrating a 5V tolerant master corner clamp 600 in accordance with an alternate embodiment of the present invention.

DETAILED DESCRIPTION

Figure 4:
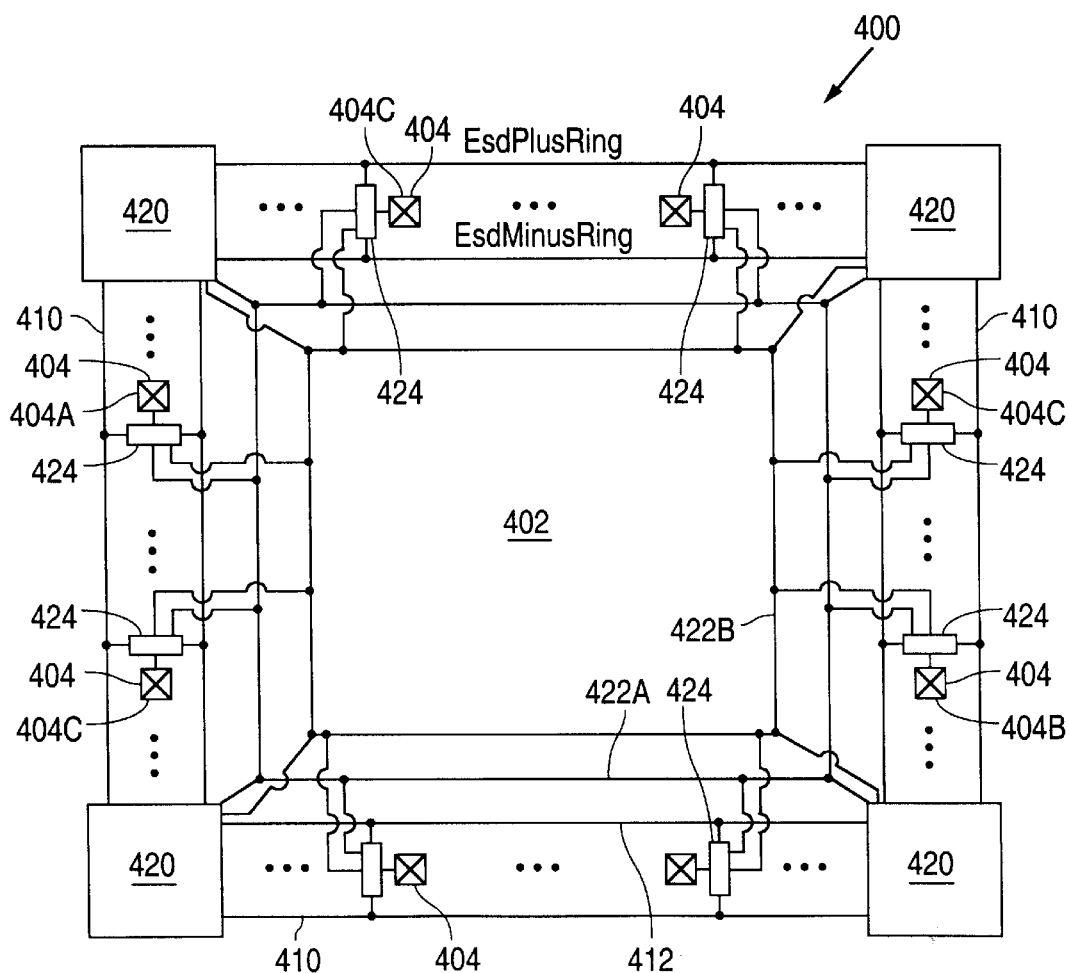
FIG. 4 is a schematic diagram illustrating an electrostatic discharge (ESD) protection circuit 400 in accordance with the present invention.
Figure 3A:
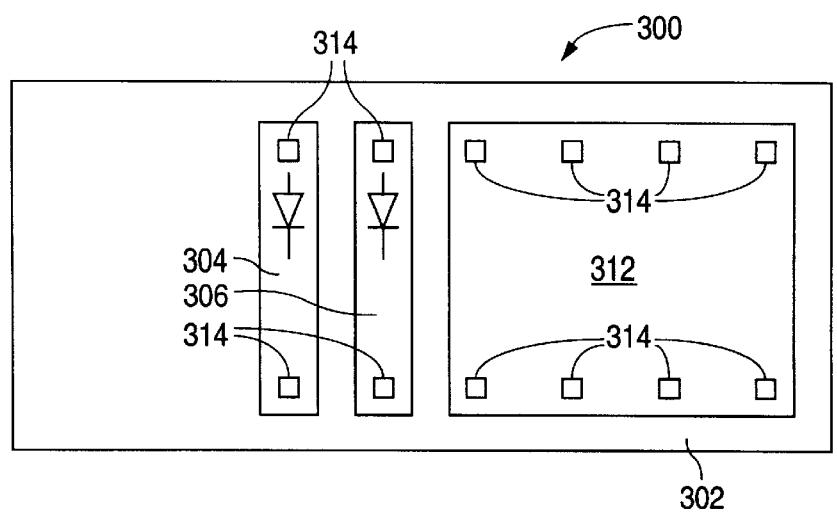
FIGS. 3A–3F are a series of plan views illustrating an example of the physical layout of a prior art I/O cell 300.
Figure 3B:
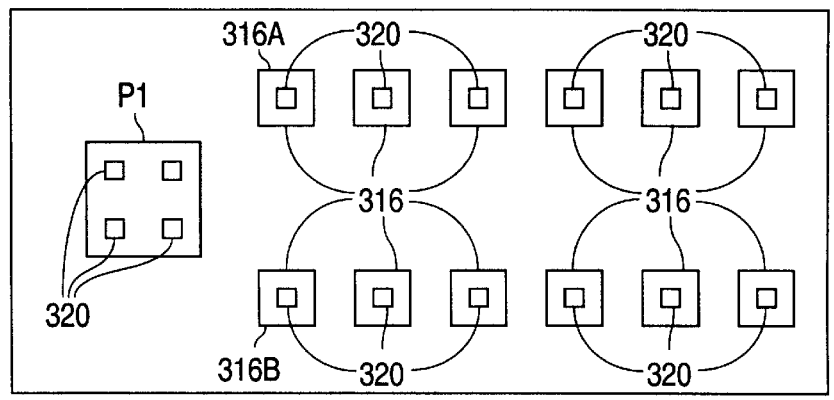
Figure 3C:
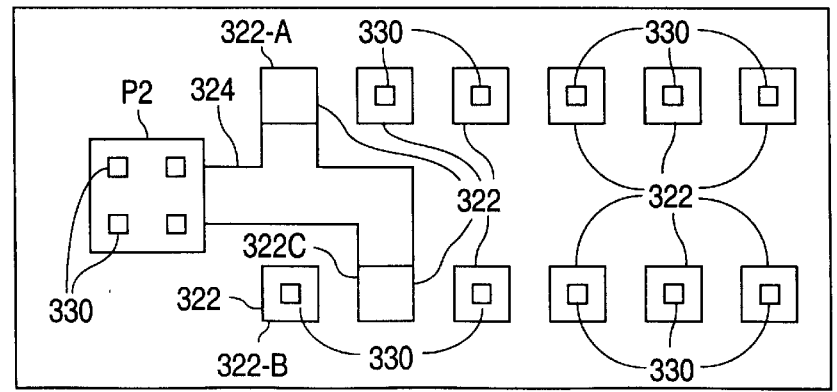
Figure 3D:
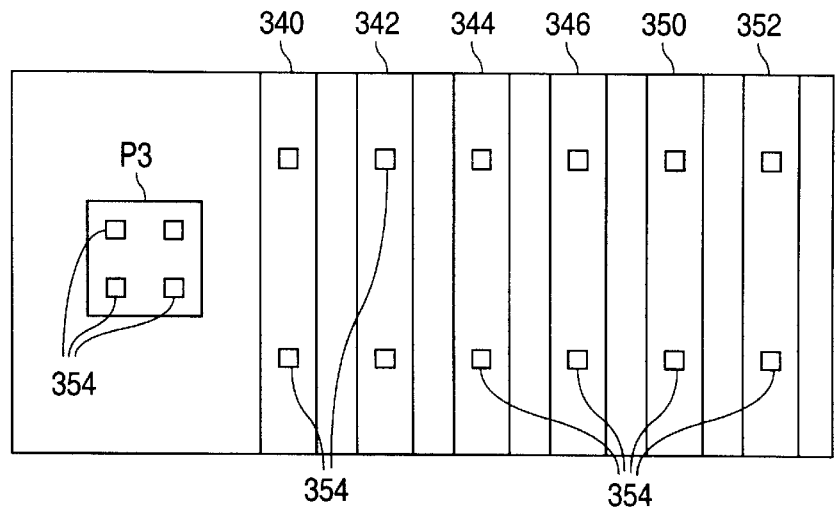
Figure 3E:
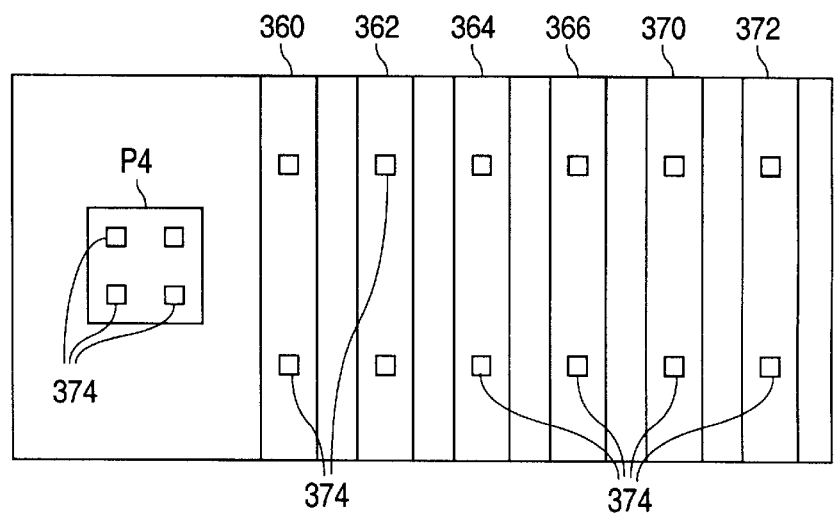
Figure 3F:
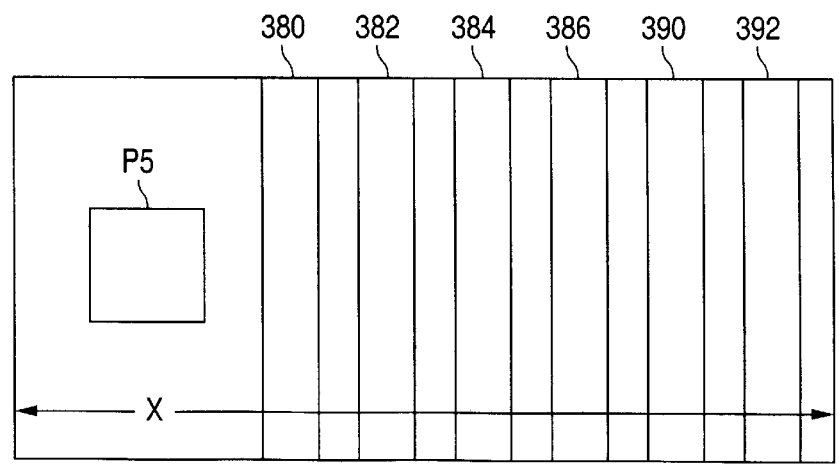

FIG. 4 shows a schematic diagram that illustrates an electrostatic discharge (ESD) protection circuit 400 in accordance with the present invention. As shown in FIG. 4, circuit 400 is formed on a semiconductor die 402 that has a number of bond pads 404, including a power pad 404A, a ground pad 404B, and I/O pads 404C.

As further shown in FIG. 4, ESD protection circuit 400 also includes an ESD plus ring 410 and an ESD minus ring 412 that extend around the periphery of die 402. In addition, circuit 400 includes four master corner clamps 420 that are connected to ESD plus ring 410 and ESD minus ring 412, and trigger rings 422A and 422B that extend around the periphery of die 402 to connect to each corner clamp 420. Circuit 400 further includes a plurality of slave clamps 424 that are connected to the bond pads 404, ESD plus ring 410, ESD minus ring 412, and trigger rings 422A and 422B.

Figure 5A:
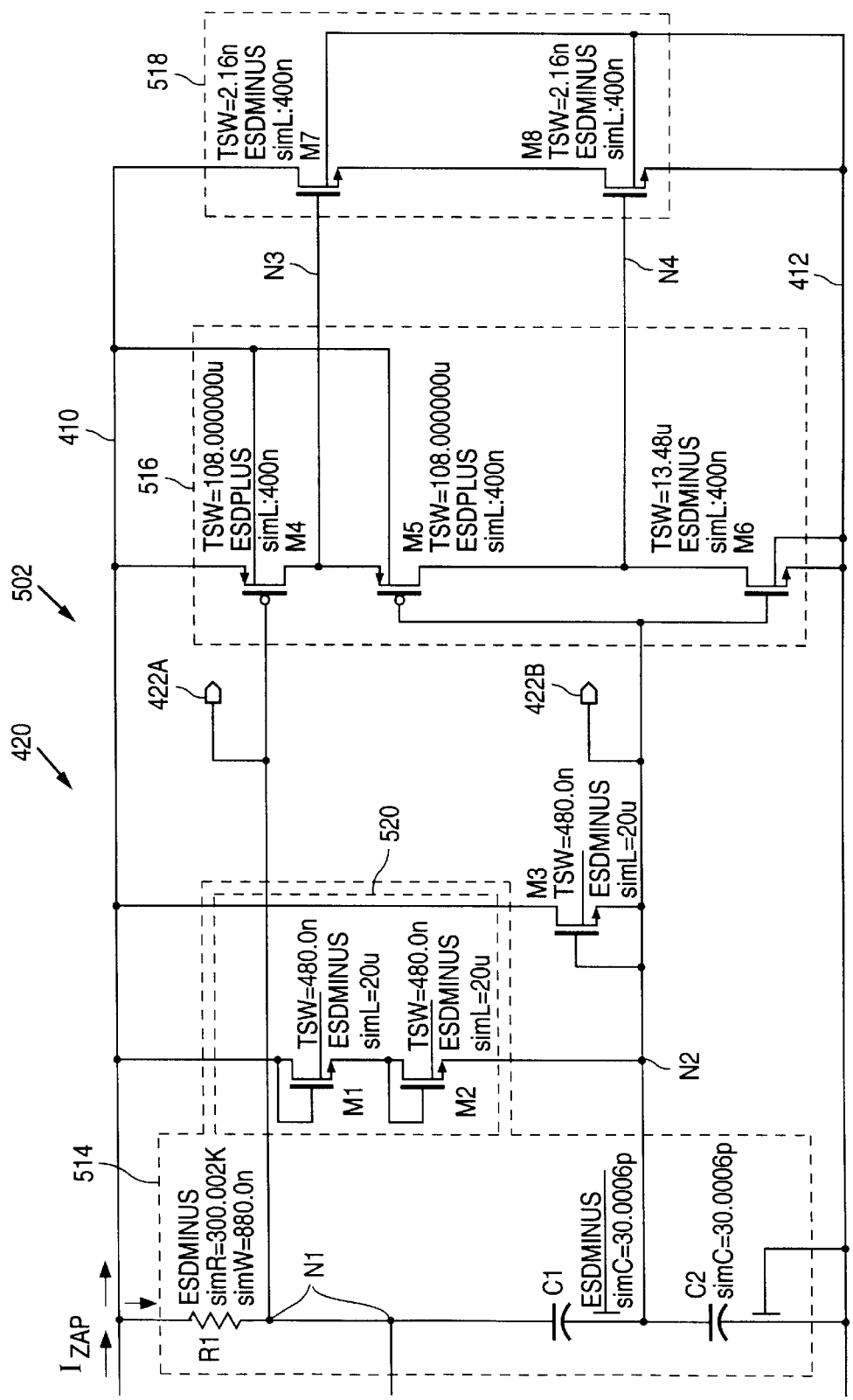
FIGS. 5A–5B are circuit diagrams illustrating a 5V tolerant master corner clamp 500 in accordance with the present invention.
Figure 5B:
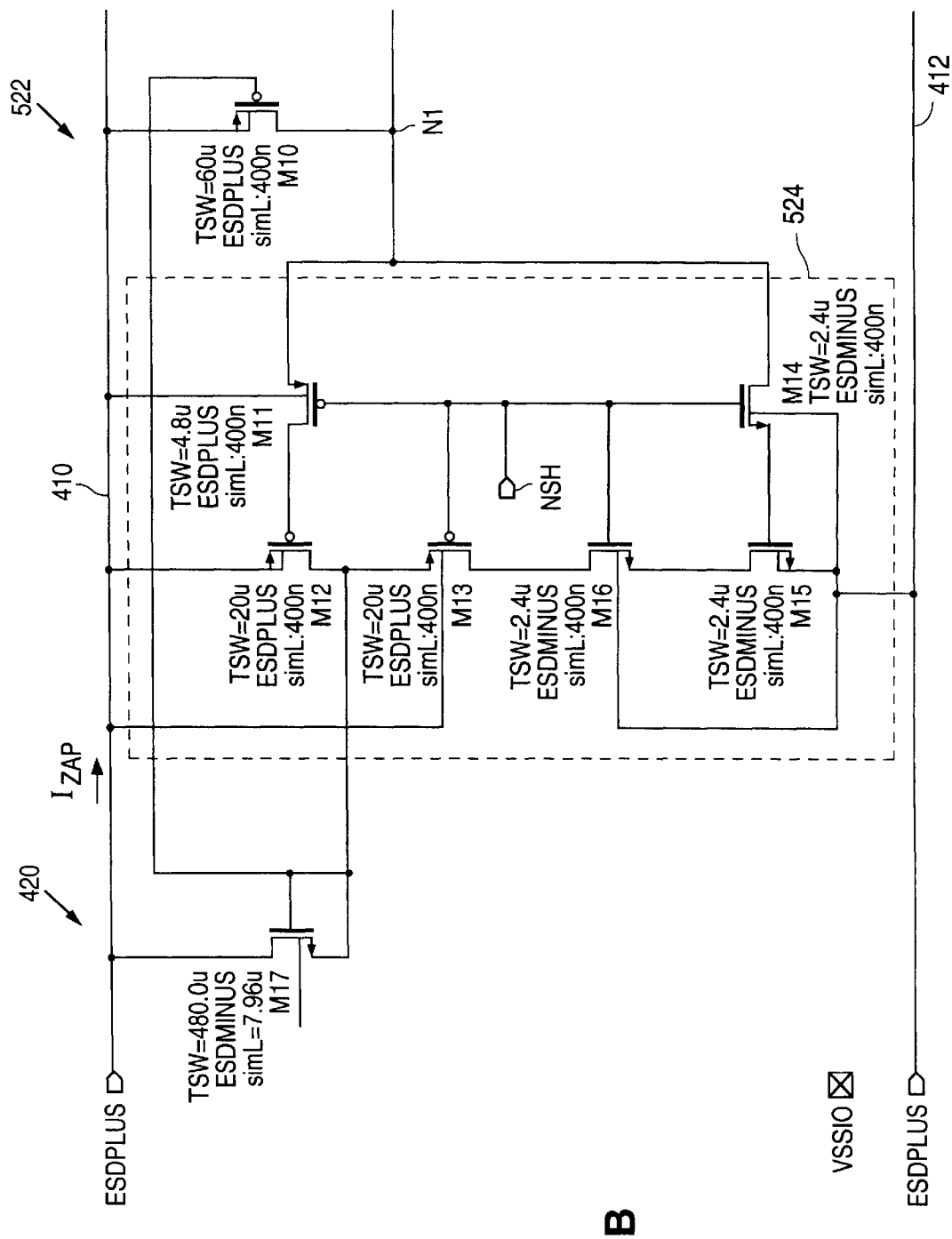

FIGS. 5A–5B show circuit diagrams that illustrate master corner clamp 420 in accordance with the present invention. As described in greater detail below, clamp 420 provides 5V tolerance by utilizing a keep off circuit that prevents clamp 420 from triggering when the voltage on the positive rail spikes up in response to a 5V signal.

As shown in FIG. 5A, master corner clamp 420 includes a clamp circuit 502 that provides a low impedance pathway from ESD plus ring 410 to an ESD minus ring 412 when an ESD event occurs. In addition, clamp circuit 502 provides a high impedance pathway from ring 410 to ring 412 during normal operating conditions.

As further shown in FIG. 5A, clamp circuit 502 includes a RC timing circuit 514, a pre-driver circuit 516, and a switching circuit 518. RC timing circuit 514, in turn, includes a resistor R1, a first capacitor C1, and a second capacitor C2. For example, timing circuit 514 can provide a 4.5 uS delay. Resistor R1 has a first end connected to ESD plus ring 410 and a second end connected to a first node N1.

Capacitor C1 has a first plate connected to the second end of resistor R1 and a second plate connected to a second node N2.

Capacitor C2 has a first plate connected to the second plate of capacitor C1 and a second plate connected to ESD minus ring 412. RC timing circuit 514 also includes a biasing circuit 520 and a reset transistor M3. Biasing circuit 520 is connected to ESD plus ring 410 and second node N2 to set the voltage on node N2. In the example shown in FIG. 5A, biasing circuit 520 is implemented with a pair of biasing transistors M1 and M2 that are configured are diodes, and thereby set the voltage on node N2 to be two diode drops less than the voltage on ESD plus ring 410. Reset transistor M3 has a drain connected to ESD plus ring 410, and a gate and source connected to second node N2.

Pre-driver circuit 516 includes a PMOS transistor M4, a PMOS transistor M5, and a NMOS transistor M6. Transistor M4 has a source connected to ESD plus ring 410, a gate connected to node N1 and trigger line 422A, and a drain connected to a node N3. Transistor M5 has a source connected to the drain of transistor M4, a gate connected to node N2 and trigger line 422B, and a drain connected to a node N4. Transistor M6 has a source connected to ESD minus ring 412, a gate connected to node N2, and a drain connected to a node N4.

Switching circuit 518 includes a NMOS transistor M7 that has a source, a gate connected to node N3, and a drain connected to ESD plus ring 410. Circuit 518 also includes a NMOS transistor M8 that has a source connected to ESD minus ring 412, a gate connected to node N4, and a drain connected to the source of transistor M7.

In operation, when an ESD event occurs and a zap current $I_{ZAP}$ flows onto ESD plus ring 410, the voltage on ESD plus ring 410 spikes up dramatically. The voltage on the gate of transistor M4 and the voltage on the gates of transistors M5 and M6 also spike up but, due to the presence of RC timing circuit 514, the two gate voltages lag the voltage on ESD plus ring 410.

As a result, the gate-to-source voltage of transistor M4 falls below the threshold voltage of transistor M4, thereby turning on transistor M4 for as long as the voltage on the gate of transistor M4 lags the voltage on ring 410. When transistor M4 turns on, transistor M4 pulls up the voltage on the source of transistor M5 and the gate of transistor M7, thereby turning on transistor M7.

In addition, the voltage on the source of transistor M5 rises faster than the voltage on the gate of transistor M5, thereby turning on transistor M5. When transistor M5 turns on, the voltage on node N6 rises, thereby turning on transistor M8. When transistors M7 and M8 are turned on, clamp circuit 502 provides a low impedance pathway from ESD plus ring 410 to ESD minus ring 412. The lag provided by RC timing circuit 514 (e.g., 4.5 uS) is long enough to dissipate all of the charge from the ESD event, after which transistor M1 turns on. When transistor M1 turns on, the voltage is pulled low and the clamp is shut off.

Following an ESD event (or when the voltage on a pin is rapidly cycled ON/OFF/ON), a large charge is present on node N2. In this case, transistor M3 turns on and provides a discharge path when ESD plus ring 410 is grounded. When charge is left on node N2, transistor M6 is left turned on. If a subsequent ESD event occurs and transistor M6 is turned on, the device will fail.

Master corner clamp 420 is included in a packaged integrated circuit that is attached to a circuit board. When power has been applied to the integrated circuit and a steady state condition has been reached, a first voltage is present on both ESD plus ring 410 and the gate of transistor M4. For example, when ESD plus ring 410 is connected to a 3.3V power pad via a forward biased diode, 2.6V is present on ESD plus ring 410 and the gate of transistor M4. When the voltage on the source and gate of transistor M4 is equal to the first voltage, transistor M4 is turned off.

In addition, a second voltage that is sufficient to turn on transistor M6 is present on the gates of transistors M5 and M6. In the example shown in FIG. 5A, the second voltage, which is defined by transistors M1 and M2, is two diode drops below the first voltage. When turned on, transistor M6 pulls down the voltage on the gate of transistor M8, thereby turning off transistor M8.

When transistor M8 is turned off, clamp circuit 502 provides a high impedance pathway from ESD plus ring 410 to ESD minus ring 412. In addition, transistor M6 also pulls down the voltage on node N3 to be a diode drop greater than the voltage on node N2, thereby turning off transistor M5.

As shown in FIG. 5B, clamp 420 also includes a keep off circuit 522 that prevents clamp circuit 502 from falsely triggering when a 5V signal is driven onto a signal pad. Keep off circuit 522, in turn, includes a keep off transistor M10, and a control circuit 524 that is connected to keep off transistor M10. Transistor M10 has a drain connected to node N1, a gate connected to control circuit 524, and a source connected to ESD plus ring 410.

Control circuit 524 includes PMOS transistors M11, M12, and M13, and NMOS transistors M14, M15, and M16. PMOS transistor M11 has a source connected to node N1, a gate connected to a shield node NSH, and a drain. PMOS transistor M12 has a source connected to ESD plus ring 410, a gate connected to the drain of transistor M11, and a drain. PMOS transistor M13 has a source connected to the drain of transistor M12 and the gate of transistor M10, a gate connected to the shield node NSH, and a drain.

NMOS transistor M14 has a source, a gate connected to the shield node NSH, and a drain connected to node N1. NMOS transistor M15 has a source connected to ESD minus ring 412, a gate connected to the source of transistor M14, and a drain. NMOS transistor M16 has a source connected to the drain of transistor M15, a gate connected to the shield node NSH, and a drain connected to the drain of transistor M13.

In addition, keep off circuit 522 also includes a NMOS reset transistor M17 that has a drain connected to ESD plus ring 410, and a gate and a source connected to the source of transistor M13. Transistor M17, which is normally off, provides a leakage path to discharge the source of transistor M13 to ESD plus ring 410 when ring 410 is grounded.

Transistor M17 helps reset keep off circuit 522 when the voltage connected to any pin on the chip is rapidly cycled ON/OFF/ON.

In operation, when an ESD event occurs and a zap current $I_{ZAP}$ flows onto ESD plus ring 410, the voltage on ESD plus ring 410 spikes up dramatically. The rising voltage on the source of transistor M12 causes transistor M12 to turn on. When transistor M12 turns on, the voltage on the source of transistor M13 and the gate of transistor M10 rises. Since transistor M10 has the same gate and source voltages, transistor M10 is turned off during an ESD event. As a result, clamp circuit 502 works during an ESD event as described above.

As further described above, when master corner clamp 420 has been included in a packaged integrated circuit that is attached to a circuit board, power has been applied, and a steady state condition has been reached, the first voltage is present on both ESD plus ring 410 and node N1. In addition, a shield voltage of approximately ½ the voltage on ESD plus ring 410 is applied to the shield node NSH. For example, with an ESD ring voltage of 2.6V, a 1.3V shield voltage is utilized.

In this condition, the voltages on node N1 and the shield node NSH are sufficient to turn on transistor M11 which, in turn, increases the voltage on the gate of transistor M12, thereby turning transistor M12 off. The voltages on node N1 and the shield node NSH are also sufficient to turn on transistor M14 enough to pull up the voltage on the source of transistor M14 to be a diode drop below the shield voltage on the shield node NSH.

A voltage that is a diode drop below the shield voltage is sufficient to turn on transistor M15 which, in turn, pulls down the voltage on the source of transistor M16, thereby turning on transistor M16. When transistor M16 turns on, the voltage on the drain of transistor M13 is also pulled low which, in turn, pulls the voltage on the source of transistor M13 to a diode drop above the shield voltage on the shield node NSH.

Thus, the voltage on the source of transistor M13 and the gate of transistor M10 is a diode drop above the shield voltage. When the voltage on the gate of transistor M10 is a diode drop above the shield voltage and the source of transistor M10 is equal to the first voltage, transistor M10 is turned on, thereby shorting ESD plus ring 410 to node N1.

When a 5V signal is driven onto a signal pad and ESD plus ring 410 spikes up to 4.3V (or 4.8V), the voltage on node N1 immediately follows the spike on ESD plus ring 410. This is because transistor M10 conducts enough current to prevent the voltage on node N1 from falling more than a diode drop below the voltage on ESD plus ring 410 when the voltage on ring 410 rises from 2.6V to 4.3V (or 4.8V).

As a result, the gate-to-source voltage of transistor M4 is not able to fall below the threshold voltage of transistor M4. This keeps transistor M4 from turning on which, in turn, prevents clamp 420 from false triggering.

When power is first applied to clamp 420, switching transistor M10 does not turn on until the voltage on node N1 has risen to just below the first voltage on ESD plus ring 410. When the power is initially applied to clamp 420, the rising voltage on ESD plus ring 410 (the source of transistor M12) causes transistor M12 to turn on. When transistor M12 turns on, the voltage on the source of transistor M13 and the gate of transistor M10 rises. Since transistor M10 has the same gate and source voltages, transistor M10 is turned off.

However, once the voltage on node N1 rises to a value that is a diode drop above the shield voltage, transistor M11 turns on. When the voltage on node N1 reaches a diode drop less than the voltage on ESD plus ring 410 transistor M12 turns off. At the same time, transistors M14, M15, and M16 are turned on.

Thus, when transistor M12 turns off, transistors M15 and M16 pull the voltage on the source of transistor M13 down to a diode drop above the shield voltage, thereby turning on transistor M10. In the example shown in FIGS. 5A–5B, the transistor ratio of transistors M12/M13 and M15/M16 is 8.33:1. This allows transistor M12 to quickly charge up the gate of transistor M10, and transistors M15 and M16 to slowly pull down the voltage on the gate of transistor M10 to a diode drop above the shield voltage. Thus, transistor M10 turns on at a relatively high voltage to avoid interaction with the intended ESD function.

Figure 6A:
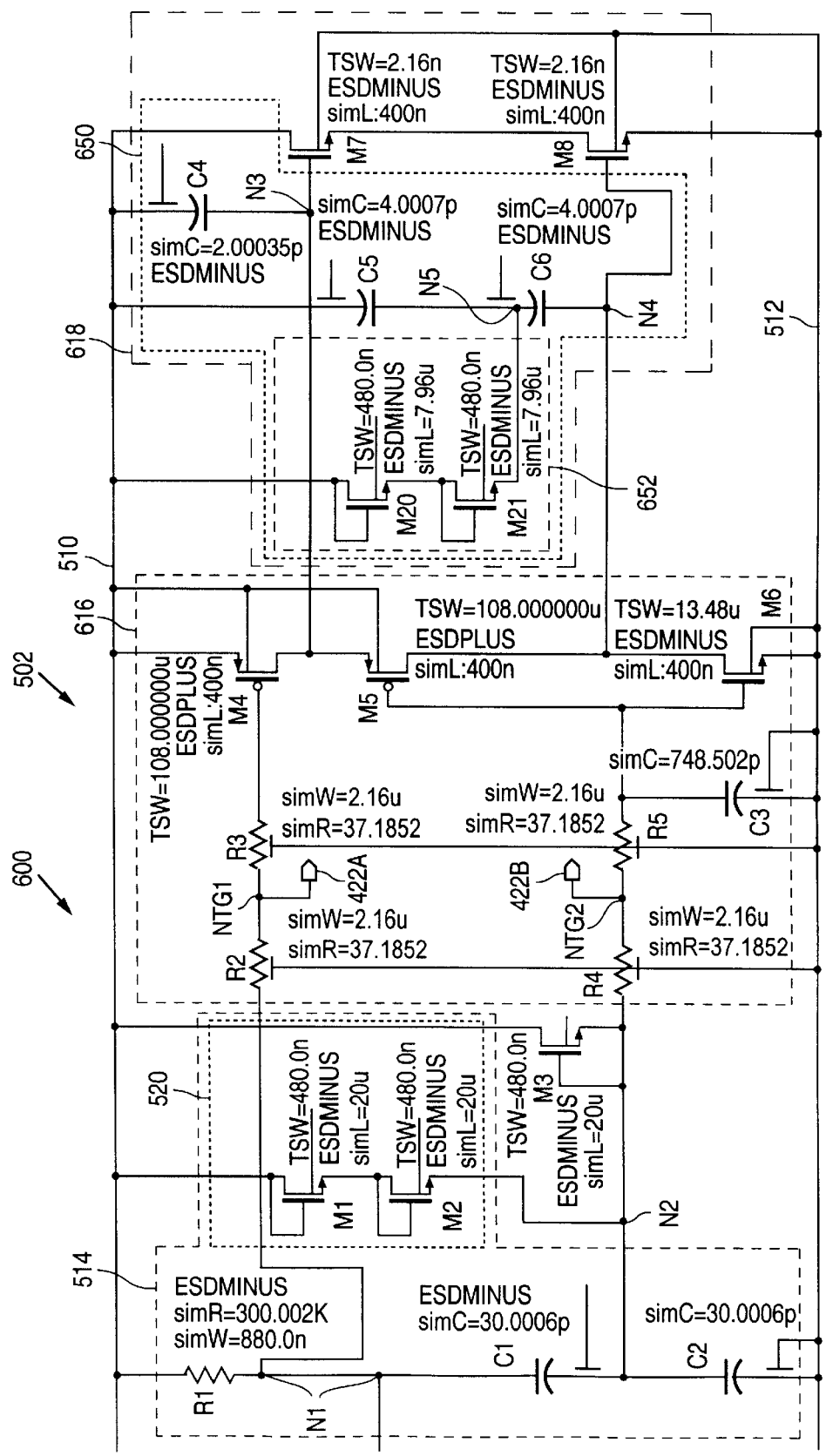

FIGS. 6A–6B show circuit diagrams that illustrate a 5V tolerant master corner clamp 600 in accordance with an alternate embodiment of the present invention. Clamp 600 is similar to clamp 420 and, as a result, utilizes the same reference numerals to designate the structures which are common to both clamps.

As shown in FIG. 6A, master corner clamp 600 differs from clamp 420 in that clamp 600 includes a pre-driver circuit 616. Pre-driver circuit 616 is the same as pre-driver circuit 516 except that circuit 616 includes resistors R2, R3, R4, and R5. Resistors R2–R5 act as antenna diodes that are utilized to prevent a charge from accumulating on nodes N1 and N2 during the fabrication of clamp 600.

Resistor R2 has a first end connected to node N1 and a second end connected to a first trigger node NTG1. Resistor R3 has a first end connected to trigger node NTG1 and a second end connected to the gate of transistor M4.

Similarly, resistor R4 has a first end connected to node N2 and a second end connected to a second trigger node NTG2. Resistor R5 has a first end connected to trigger node NTG2 and a second end connected to the gates of transistors M5 and M6.

In addition, pre-driver circuit 616 includes a capacitor C3 that has a first plate connected to the gates of transistors M5 and M6 and a second plate connected to ESD minus ring 412. During an ESD event, the Miller capacitance of transistor M5 pulls up the voltage on the gates of transistors M5 and M6 as the voltage on the source of transistor M5 increases.

This is an undesirable condition because if transistor M6 turns on during an ESD event, clamp 420 will fail. Although capacitor C2 limits the ability of transistor M6 to turn on as a result of Miller capacitance, capacitor C3 insures that transistor M6 does not turn on during an ESD event.

As further shown in FIG. 6A, clamp 600 also differs from clamp 420 in that clamp 600 includes a switching circuit 618. Switching circuit 618 is the same as switching circuit 518 except that switching circuit 618 includes a speed up circuit 650. Speed up circuit 650, in turn, includes a capacitor C4, a capacitor C5, a capacitor C6, and a biasing circuit 652.

Capacitor C4 has a first plate connected to ESD plus ring 410 and a second plate connected to node N3. Capacitor C5 has a first plate connected to ESD plus ring 410 and a second plate connected to a node N5. Capacitor C6 has a first plate connected to node N5 and a second plate connected to node N4.

Biasing circuit 652, in turn, sets the voltage on node N5. In the example shown in FIG. 6A, biasing circuit 652 is implemented with a pair of biasing transistors M20 and M21 that are configured as diodes, and thereby set the voltage on node N5 to be two diode drops less than the voltage on ESD plus ring 410.

In operation, capacitors C4, C5, and C6 store a charge that reduces the additional charge that is required to turn on transistors M7 and M8. As a result, less time is required to turn on transistors M7 and M8 after transistors M4 and M5 turn on and conduct.

As shown in FIG. 6B, clamp 600 differs from clamp 420 in that clamp 600 includes a control circuit 624. Control circuit 624 is the same as control circuit 524 except that circuit 624 includes a first inverter 660 and a second inverter 662. Inverter 660 includes a PMOS transistor M30, a PMOS transistor M31, a NMOS transistor M32, and a NMOS transistor M33.

PMOS transistor M30 has a source connected to ESD plus ring 410, a gate connected to the source of transistor M13, and a drain. PMOS transistor M31 has a source connected to the drain of transistor M30, a gate connected to the shield node NSH, and a drain.

NMOS transistor M32 has a source connected to ESD minus ring 412, a gate connected to the source of transistor M16, and a drain. NMOS transistor M33 has a source connected to the drain of transistor M15, a gate connected to the shield node NSH, and a drain connected to the drain of transistor M31.

Inverter 662 includes a PMOS transistor M34, a PMOS transistor M35, a NMOS transistor M36, and a NMOS transistor M37. PMOS transistor M34 has a source connected to ESD plus ring 510, a gate connected to the drain of transistor M30, and a drain. PMOS transistor M35 has a source connected to the drain of transistor M34, a gate connected to the shield node NSH, and a drain.

NMOS transistor M36 has a source connected to ESD minus ring 412, a gate connected to the source of transistor M33, and a drain. NMOS transistor M37 has a source connected to the drain of transistor M36, a gate connected to the shield node NSH, and a drain connected to the drain of transistor M35.

In operation, inverters 660 and 662 function as a buffer. As a result, the voltage on the drain of transistor M34 is the same as the voltage on the drain of transistor M12. However, unlike the voltage on the drain of transistor M12, the voltage on the drain of transistor M34 has a very small and well defined rise time. When the drain of transistor M12 drives the voltage on the gate of transistor M10, the voltage on the gate of transistor M10 turns on transistor M10 sooner.

Figure 7:
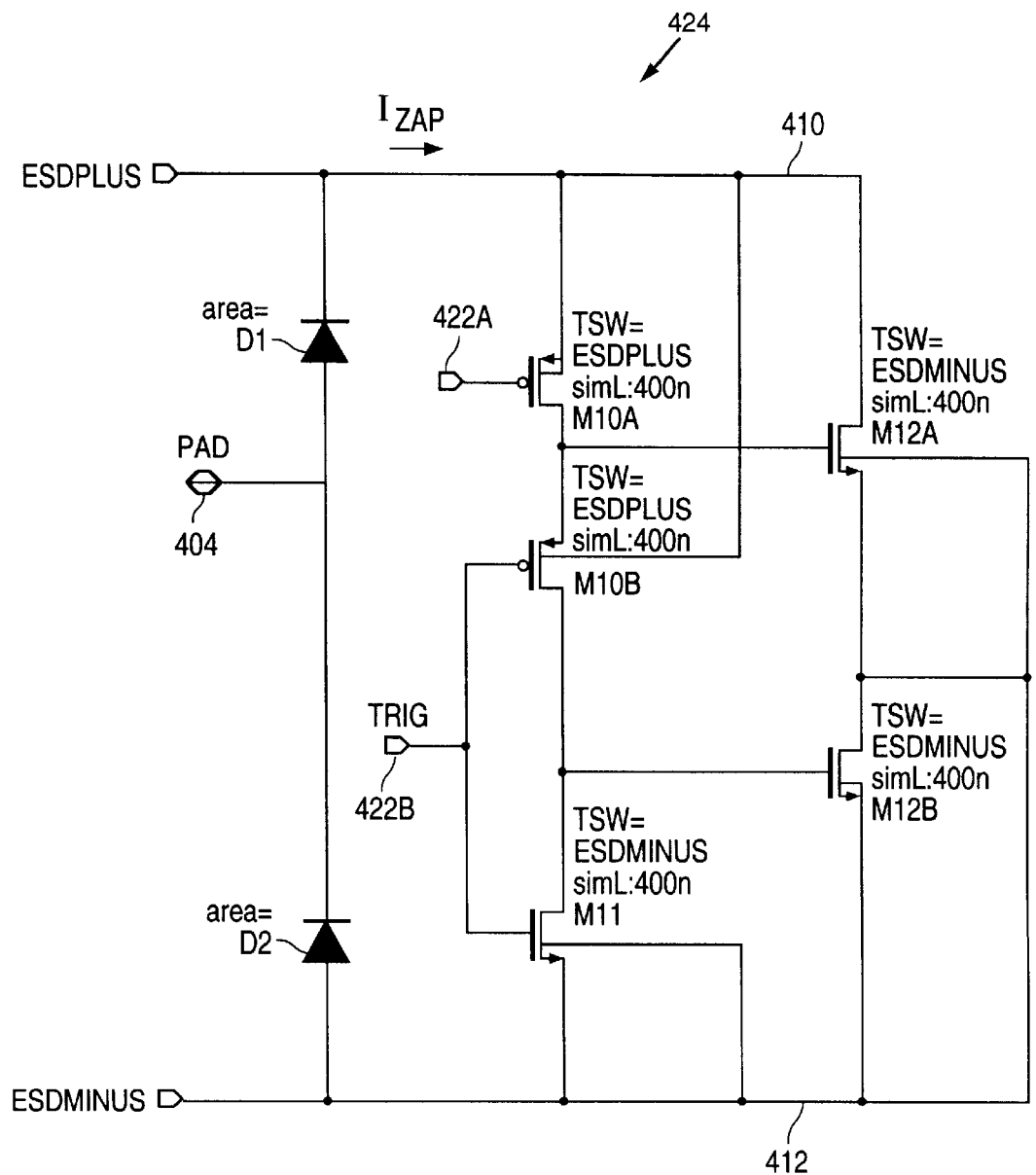
FIG. 7 is a schematic diagram illustrating slave clamp circuit 700 in accordance with the present invention.

FIG. 7 shows a schematic diagram that illustrates slave clamp circuit 424 in accordance with the present invention. As shown in FIG. 7, slave clamp circuit 424 includes a first diode D1 and a second diode D2. Diode D1 has an input that is connected to a pad 404, and an output that is connected to ESD plus line 410. Diode D2 has an input that is connected to ESD minus line 412, and an output that is connected to pad 404. (Slave clamp circuit 424 connected to ground pad 404B does not have diode D2, but instead is shorted directly to the ground pad.)

Slave clamp circuit 424 also includes a p-channel transistor M10A, a p-channel transistor M10B, and an n-channel transistor M11, which together function as an inverter, and ESD switching transistors M12A and M12B. Transistor M10A has a source that is connected to ESD plus ring 410, a gate that is connected to trigger line 422A, and a drain.

Transistor M10B has a source that is connected to the drain of transistor M10A, a gate that is connected to trigger line 422B, and a drain. Transistor M11 has a source that is connected to ESD minus ring 412, a drain that is connected to the drain of transistor M10B, and a gate that is connected to the gate of transistor M10A and to trigger line 422B.

In the example shown in FIG. 7, transistors M10A and M10B have equal lengths and a width ratio of 4:1 (transistors M10A and M10B are four times wider than transistor M11). If the device ratio is too small (M1 too large), then transistor M1 may turn on prematurely and shut off the clamp during an ESD transient.

Transistor M12A has a source, a drain that is connected to ESD plus ring 410, and a gate that is connected to the drain of transistor M10A. Transistor M12B has a source that is connected to ESD minus ring 412, a drain that is connected to source of transistor M12A, and a gate that is connected to the drains of transistors M10B and M11. The widths of transistors M12A and M12B need not be large since there are many transistors M2 and M12A and M12B in parallel. In the example shown in FIG. 7, transistors M12A and M12B have width-to-length ratios W/L of 461.76 um/400 nm.

In operation, when an ESD event occurs, a zap current $I_{ZAP}$ flows onto ESD plus ring 410, and the voltage on ESD plus ring 410 spikes up dramatically. The voltages on the gates of transistors M10A, M10B, and M11 also spike up but, due to the presence of RC timing circuit 510 via trigger lines 422A and 422B, the gate voltages lag the voltage on ESD plus ring 410.

As a result, the gate-to-source voltage of transistor M10A falls below the threshold voltage of transistor M10A, thereby turning on transistor M10A for as long as the gate voltage lags the voltage on ESD plus ring 410. When transistor M10A turns on, transistor M10A pulls up the voltage on the gate of transistor M12A, thereby turning on transistor M12A.

Transistor M10A also pulls up the voltage on the source of transistor M10B. As a result, the gate-to-source voltage of transistor M10B falls below the threshold voltage of transistor M10B, thereby turning on transistor M10B for as long as the gate voltage lags the voltage on ESD plus ring 410. When transistor M10B turns on, transistor M10B pulls up the voltage on the gate of transistor M12B, thereby turning on transistor M12B. When transistors M12A and M12B are turned on, slave clamp 424 provides a low impedance pathway from ESD plus ring 410 to ESD minus ring 412.

One advantage of the present invention is that a large effective clamp size can be obtained with smaller device sizes because the effective clamp size is the sum of each master corner clamp and each slave clamp circuit. The master corner clamps are cascoded and, because of this, have an inherently higher turn on resistance. Distributing the slave clamps under the pads allows a much larger effective cascoded clamp to be built, thereby lowering the turn on resistance and providing better ESD performance.

Another advantage of the present invention is that the effective clamp size scales directly with the pin count. As a result, a chip with a larger pin count has a larger effective clamp size than a chip with a smaller pin count. Further, the present invention also allows reliable ESD protection to be added to an I/O cell as easily as placing a bond pad. This reduces I/O library development time, and the risk of ESD failures by using a proven design.

Another advantage of the present invention over prior art approaches which utilize only corner clamps is that the distance the ESD current ($I_{ZAP}$) has to travel (and it's associated IR drop/voltage buildup) before the current is shunted to the ESD minus ring 412 is minimized. In the present invention, if pad 404B (see FIG. 4) is zapped positively with respect to adjacent pad 404C, the ESD current flows from pad 404B through diode D1 of the slave clamp circuit associated with pad 404B to ESD plus ring 410. The ESD current then immediately flows through transistors M12A and M12B of the slave clamp circuit associated with pad 404B to ESD minus ring 412. Since there are multiple clamp transistors M12A and M12B in adjacent pads, these transistors also share in shunting the current to ESD minus ring 412. The current then conducts out the bottom diode D2 of pad 404C, and out the bond pad 404C.

Figure 1:
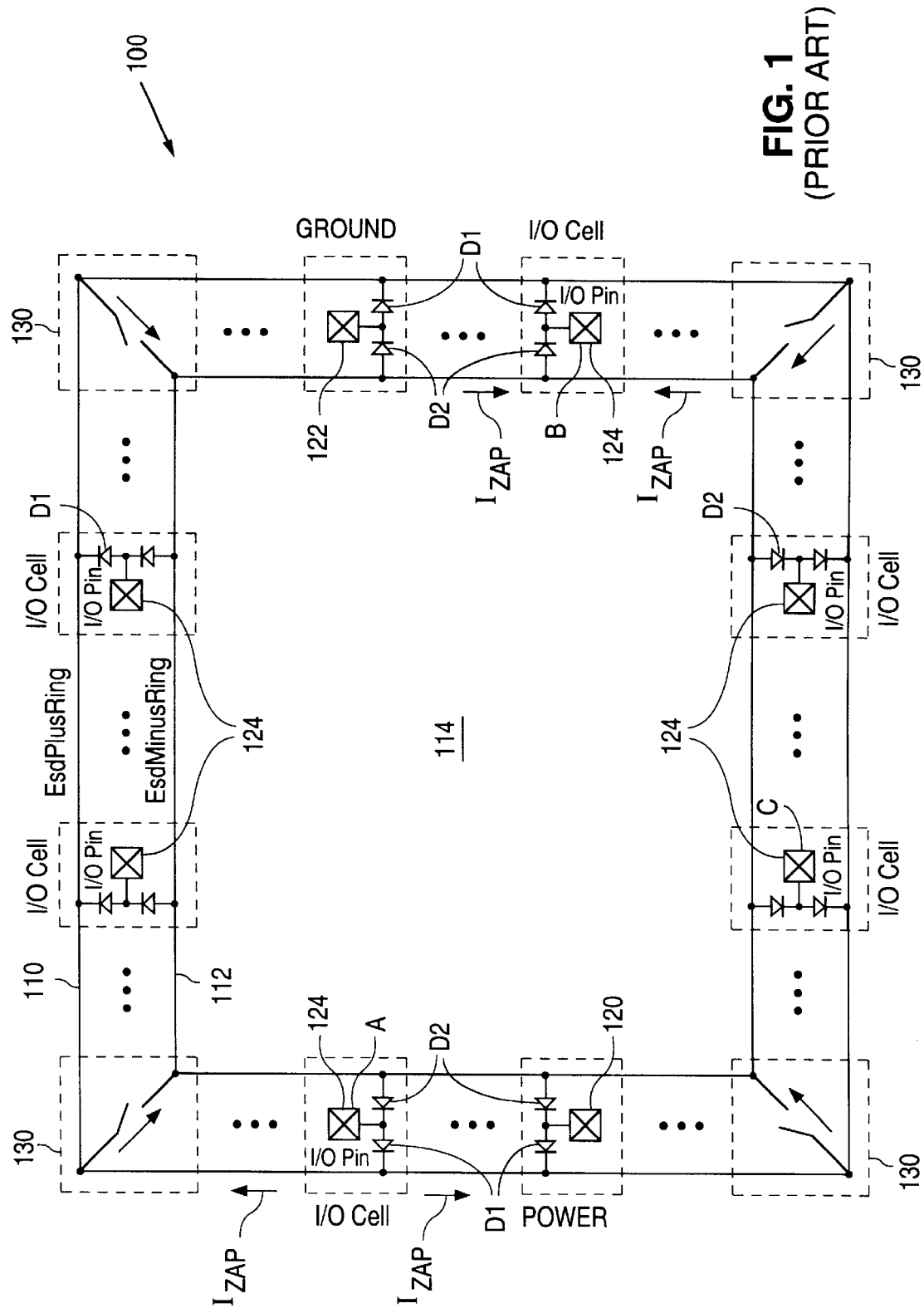
FIG. 1 is a schematic diagram illustrating a prior-art ESD protection circuit 100.
Figure 2:
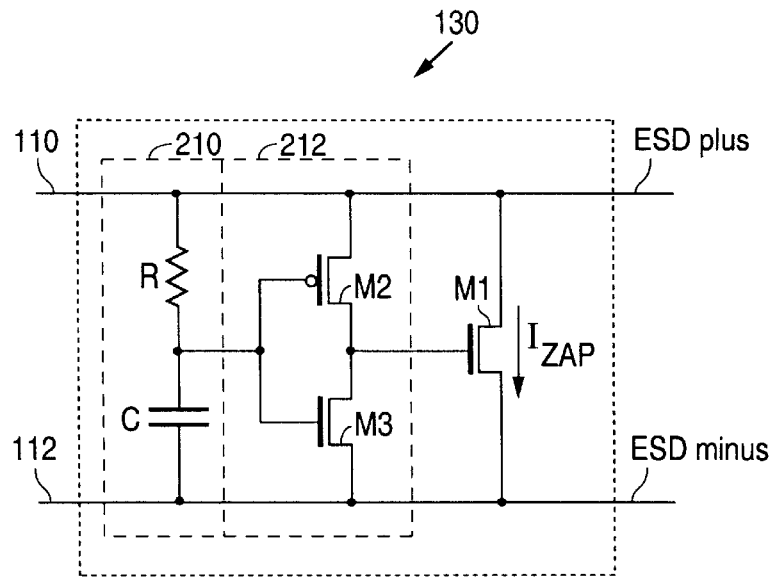
FIG. 2 is a schematic diagram illustrating a prior art corner clamp 130.

In contrast, if pad 106 adjacent to pad 104 in FIG. 1 is zapped positively with respect to pad 104, the ESD current has to travel from pad 106 through the upper diode D1 associated with pad 106. From here, the current has to travel down the length of ESD plus ring 110 to corner clamp 116. From here, the current has to travel back to the lower diode D2 associated with pad 104, and out pad 104. The voltage buildup due to the IR drop in the ESD plus ring 110 and ESD minus ring 112 can become excessive, especially on a large die, and cause the chip to fail.

Another advantage of the present invention is that the present invention improves ESD performance when pads are zapped across the die. In the present invention, both ESD plus ring 410 and ESD minus ring 412 more effectively conduct the ESD current around the chip by allowing the current to flow in both ESD plus ring 410 and ESD minus ring 412 in parallel immediately after passing thru diode D1 and transistors M12A and M12B in the local slave clamp, which minimizes IR drops and improves ESD. With the prior art approaches there is an increased voltage buildup because only ESD plus ring 110 is utilized for a maximum of ½ the chip dimension before being shunted to ESD minus ring 112.

Figure 8A:
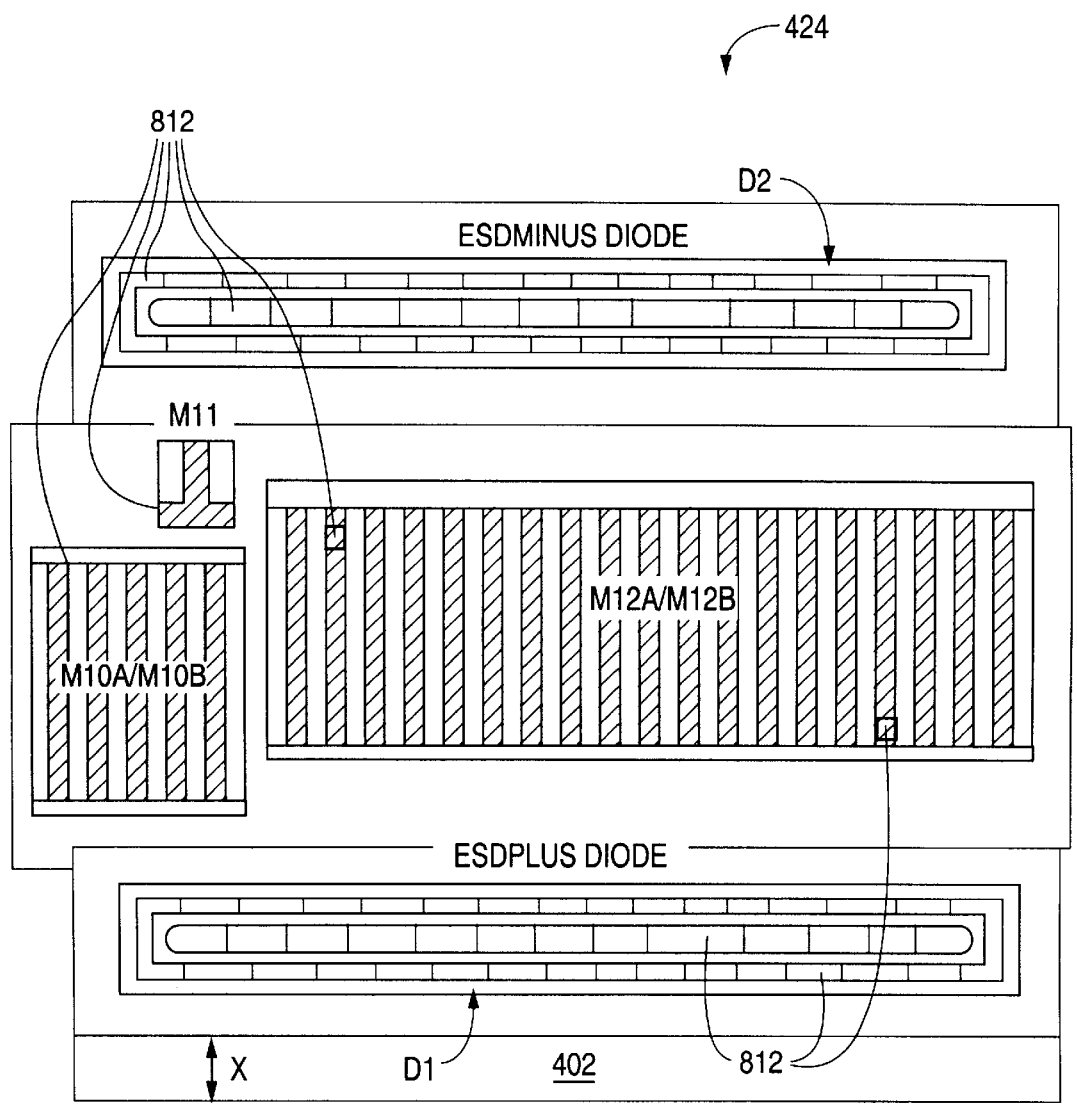
FIGS. 8A–8G are a series of plan views illustrating an example of the physical layout of slave clamp circuit 700 in accordance with the present invention.

FIGS. 8A–8G show a series of plan views that illustrate an example of the physical layout of slave clamp circuit 424 in accordance with the present invention. As shown in FIG. 8A, diode D1 and diode D2 are formed in die 402. Diodes D1 and D2 are formed as P+/N– single finger diodes to have a P+ area of approximately 100 square microns. Each of the p+ region in an I/O cell is connected to ESD minus ring 412. This keeps the body voltage of the ESD clamp and predrive devices referenced to a common ground point, the only ground point in the system during an ESD event. Diodes D1 and D2 can be reduced from 100 square microns to 50 square microns for RF applications to minimize capacitance.

In addition, transistors M10A, M10B, M12A, and M12B are formed in and on die 402 between first and second diodes D1 and D2. Transistors M10A and M10B are formed adjacent to diode D1 as interleaved multifingered transistors, while transistor M11 is formed adjacent to diode D2.

Figure 8B:
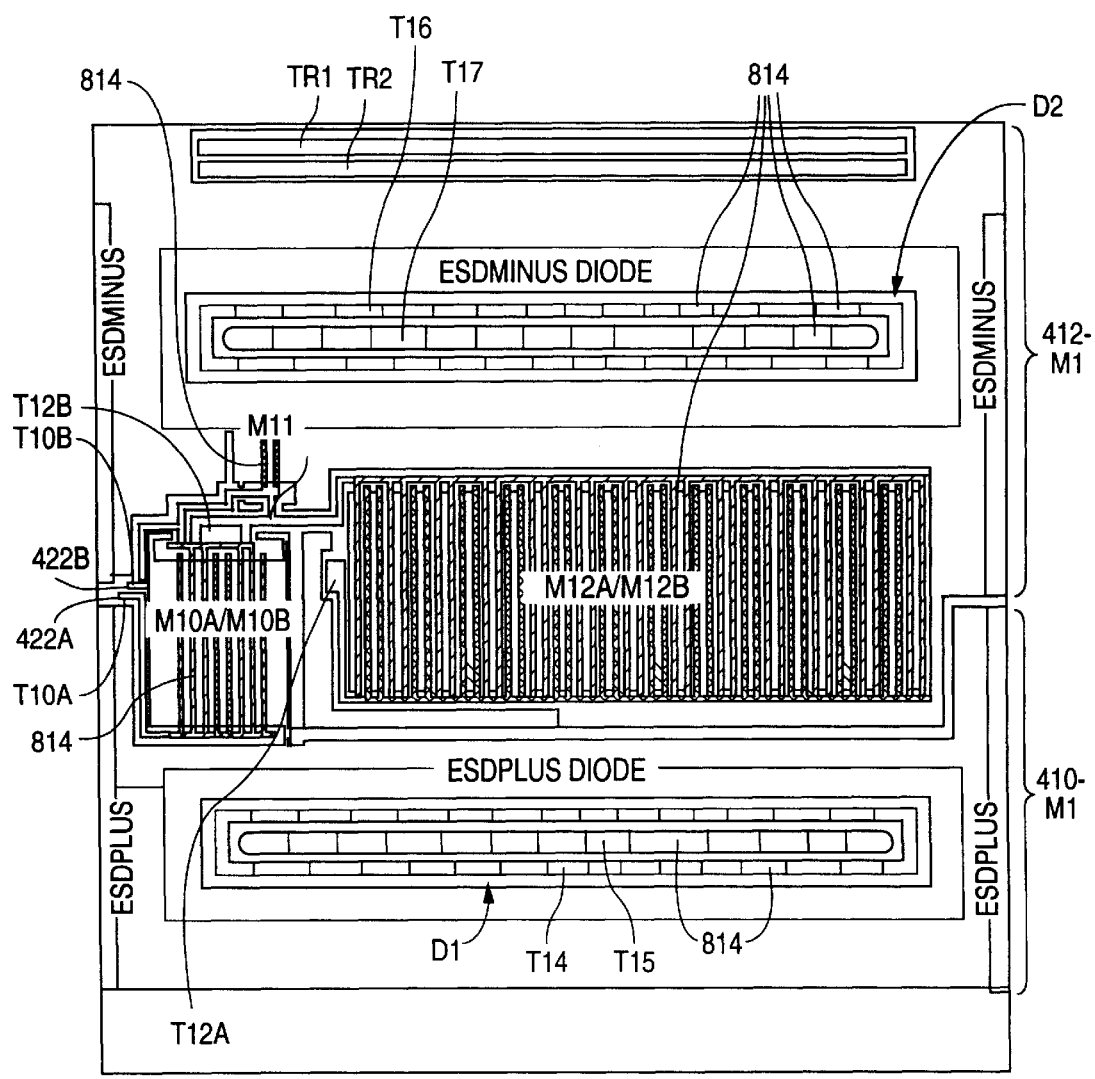
Figure 8C:
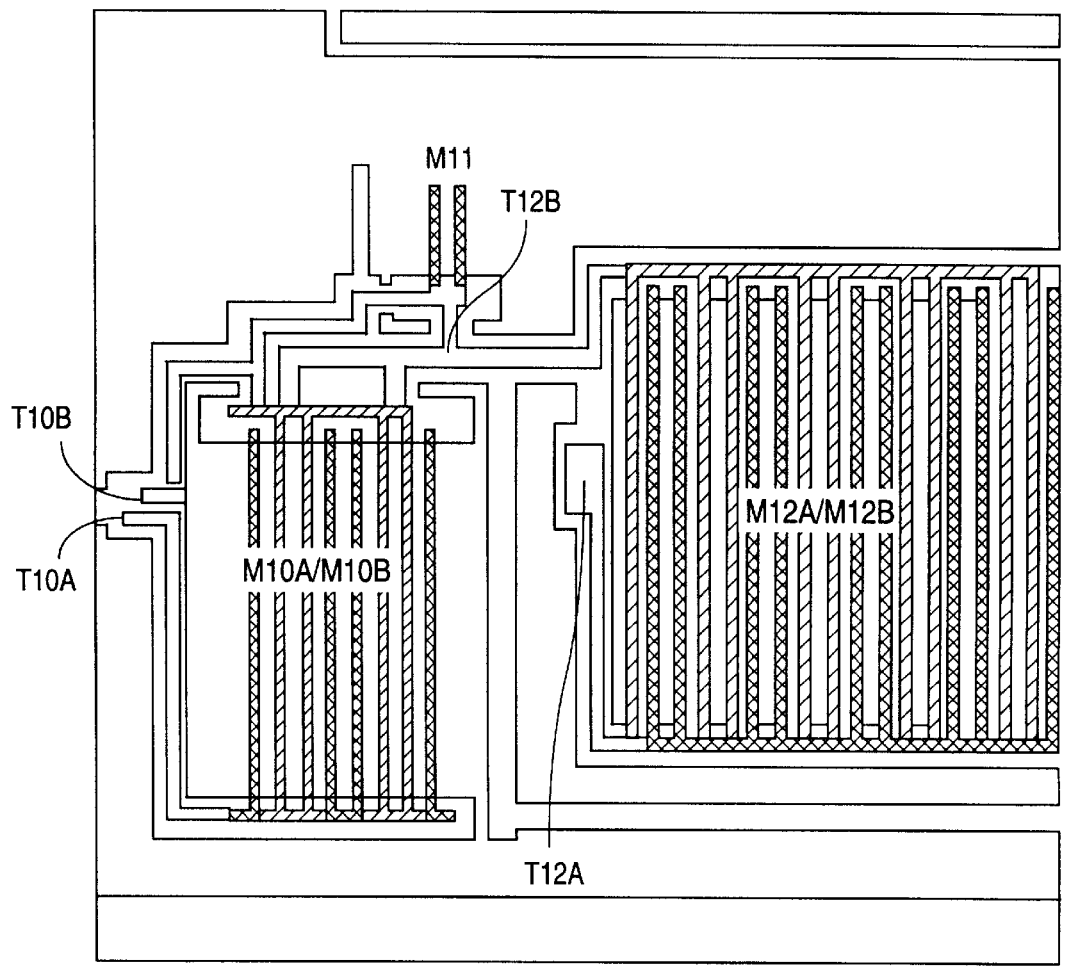

Transistors M12A and M12B are formed as interleaved multifingered transistors midway between diodes D1 and D2. (Devices should not be formed in the bottom 10 um of the I/O cell area, the distance X from the edge of diode D1 to the edge of the die, to avoid possible mechanical fracturing of a device in this high stress area of the die.) Circuit 424 also includes a number of contacts 812 (only a few of the many illustrated contacts are labeled 812) that are formed through a first layer of dielectric material formed on die 402 to make electrical connections with diodes D1 and D2, transistors M10A, M10B, M11, M12A, and M12B. (The number and placement of contacts 812 are merely illustrative, and are not intended to limit the present invention.) Referring to FIGS. 8B and 8C, ESD plus ring 410 and ESD minus ring 412 are formed from a first layer of metal (metal-1) as an ESD plus ring 410-M1 and an ESD minus ring 412-M1. (The ESD rings traverse from left to right, forming a routing pin at the edges of the pad for the place and route tool to route continuous ESD rings around the die.) ESD plus ring 410-M1 and ESD minus ring 412-M1 do not cover diode D1 and D2, or transistors M10A/M10B, M11, and M12A/M12B.

In addition, circuit 424 includes a number of traces that are formed from the metal-1 layer, including a gate trace T10A connected to the gate of transistor M10A, and a gate trace T10B connected to the gate of transistor M10B and transistor M11. In addition, a gate trace T12A is formed from the metal-1 layer to be connected to the drain of transistor M10A, the source of transistor M10B, and the gate of transistor M12B. Further, a gate trace T12B is formed from the metal-1 layer to be connected to the drains of transistors M10A and M10B, and the gate of transistor M12B. Trigger traces TR1 and TR2 are also formed from the metal-1 layer.

In addition, first and second metal-1 regions T14 and T15 are formed from the metal-1 layer and connected to the contacts 812 that are connected to diode D1, and third and fourth metal-1 regions T16 and T17 are formed from the metal-1 layer and connected to the contacts 812 connected to diode D2.

Circuit 424 also includes a number of vias 814 (only a few of the many illustrated vias are labeled 814) that are formed through a second layer of dielectric material (formed on the first layer of dielectric material, the metal-1 traces, and the metal-1 regions) to make electrical connections with diodes D1 and D2, traces T10A, T10B, T11, T12A, T12B, TR1, and TR2, metal-1 regions T14, T15, T16, T17, ESD plus ring 410-M1, and ESD minus ring 412-M1. (The number and placement of vias 814 are merely illustrative, and are not intended to limit the present invention.)

Figure 8D:
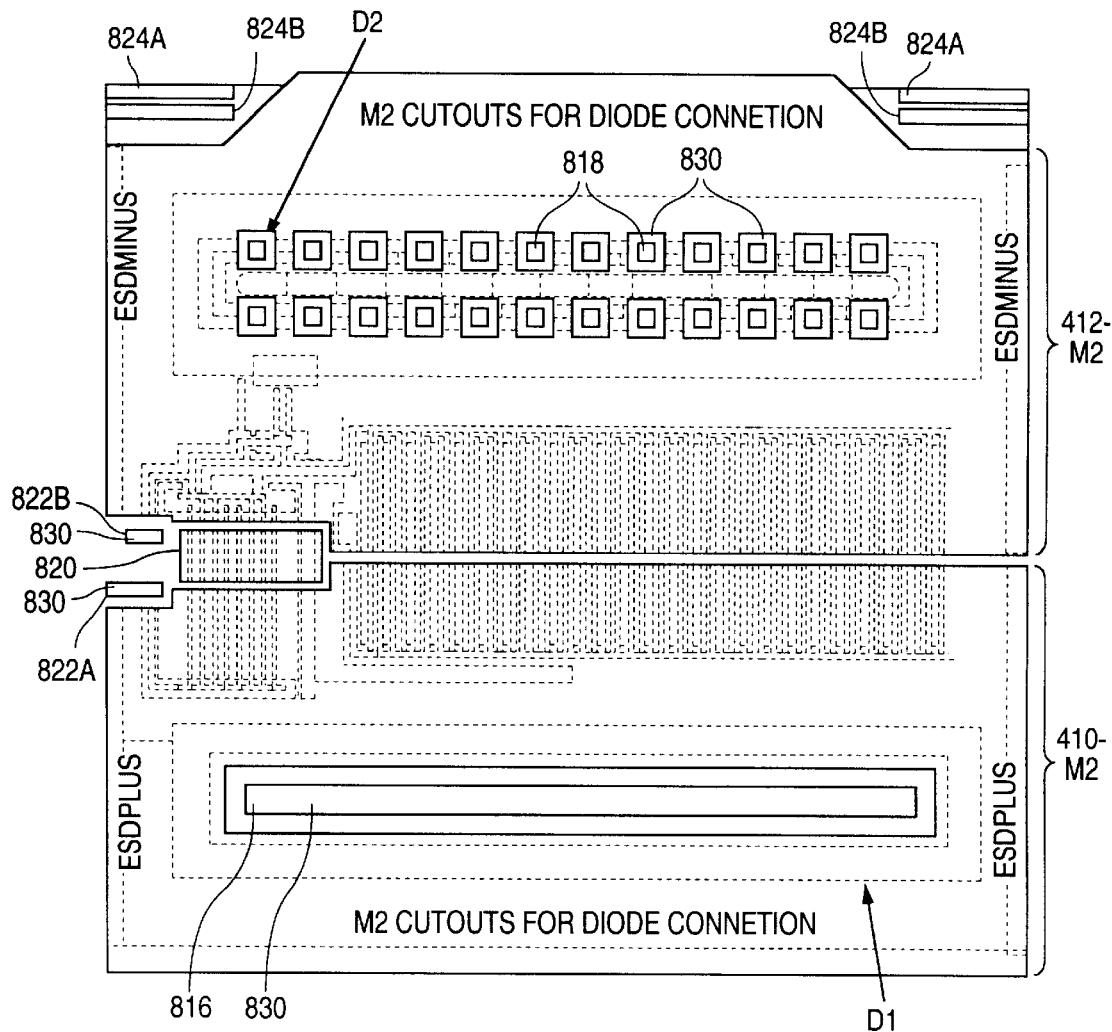

Referring to FIG. 8D, ESD plus ring 410 and ESD minus ring 412 are again formed from a second layer of metal (metal-2) as an ESD plus ring 410-M2 and an ESD minus ring 412-M2. ESD plus ring 410-M2, which is drawn out to the edge of the die, makes electrical connections with the vias 814 that are connected to ESD plus ring 410-M1, the cathode of diode D1, the source of transistor M10A, and the drain of transistor M12A.

ESD minus ring 412-M1 makes electrical connections with the vias 814 that are connected to ESD minus ring 412-M1, the anode of diode D2, the source of transistor M11, and the source of transistor M12B. ESD plus ring 410-M2 and ESD minus ring 412-M2 also have openings.

In addition, circuit 424 includes a metal-2 region 816 that is formed from the metal-2 layer in a first opening in ESD plus ring 410-M2. Metal-2 region 816 makes electrical connections with the vias 814 that are connected to the anode of diode D1. Circuit 424 also includes a number of metal-2 regions 818 that are formed from the metal-2 layer in a number of second openings in ESD minus ring 412-M2.

Metal-2 regions 818 make electrical connections with the vias 814 that are connected to the cathode of diode D2. (Diodes D1 and D2 are drawn to about 80% of the width of the to-be-formed pads 404. This minimizes the sizes of the openings formed in ESD plus and minus rings 410-M2 and 412-M2, and maximizes the metal connection down to diodes D1 and D2.)

Further, circuit 424 includes a metal trace 820 that makes electrical connections with the vias 814 that are connected to the drain of transistor M10A and the gate of transistor M12A, and metal traces 822A and 822B that makes electrical connections with the vias 814 that are connected to gate traces T10A and T10B.

In addition, circuit 424 includes a metal trace 824A and a metal trace 824B that makes electrical connections with the vias 814 that are connected to trigger traces TR1 and TR2, respectively. Traces 820, 822A, 822B, 824A, and 824B are formed from the metal-2 layer.

Circuit 424 additionally includes a number of vias 830 that are formed through a third layer of dielectric material (formed on the second layer of dielectric material, the metal-2 traces, lines, and regions) to make electrical connections with rings 410-M2 and 412-M2, regions 816 818, and traces 820, 822A, 822B, 824A, and 824B. (The number and placement of vias 830 are merely illustrative, and are not intended to limit the present invention.)

In addition, ESD minus ring 412-M2 is also formed over trigger traces TR1 and TR2 to shield traces TR1 and TR2. By shielding trigger traces TR1 and TR2 with ESD minus ring 412-M2, which is substantially at ground during normal operation, noise coupling is minimized. As a result, false triggering of the clamps is unlikely to occur.

Circuit layout should be drawn in second metal layer M2 and below as possible to keep as much of the circuit interconnect in the first metal layer M1 and polysilicon. This helps to maintain as much solid M2 as possible for low resistance ESD plus and minus rings 410 and 412, as well as keep the critical slave clamp circuits as protected as possible from mechanical damage from wafer probe, wire bond, and package stress.

Figure 8E:
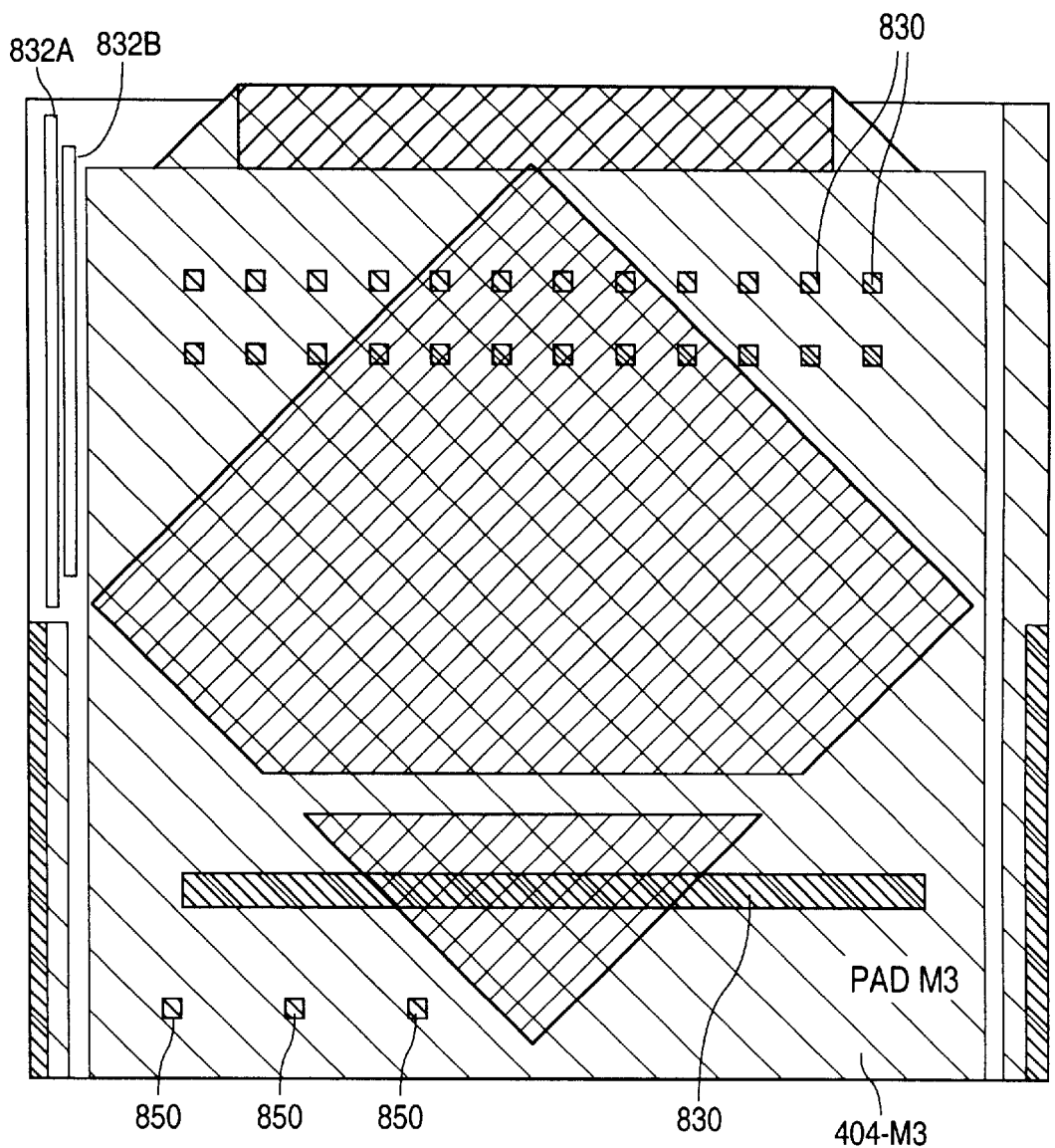
Figure 8F:
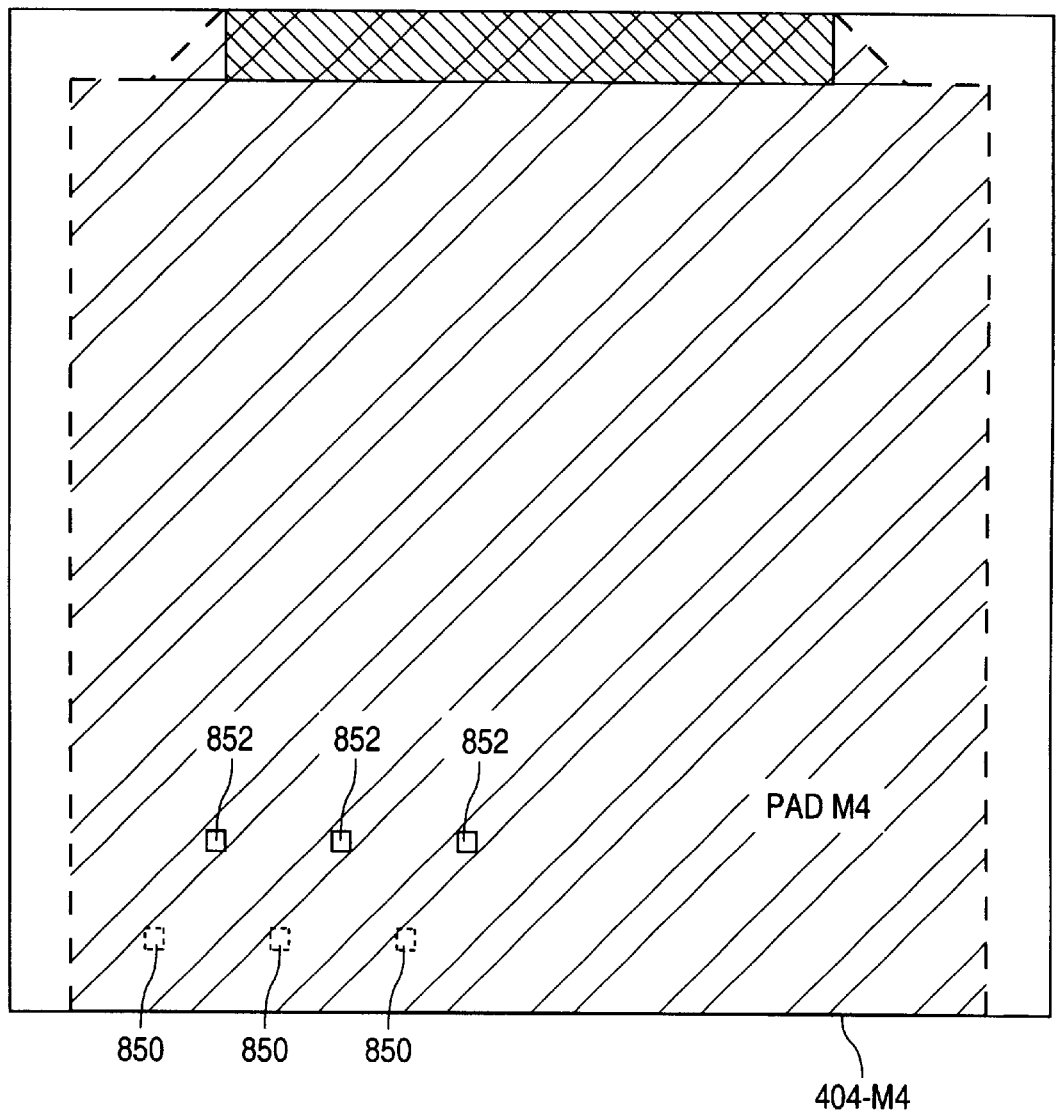
Figure 8G:
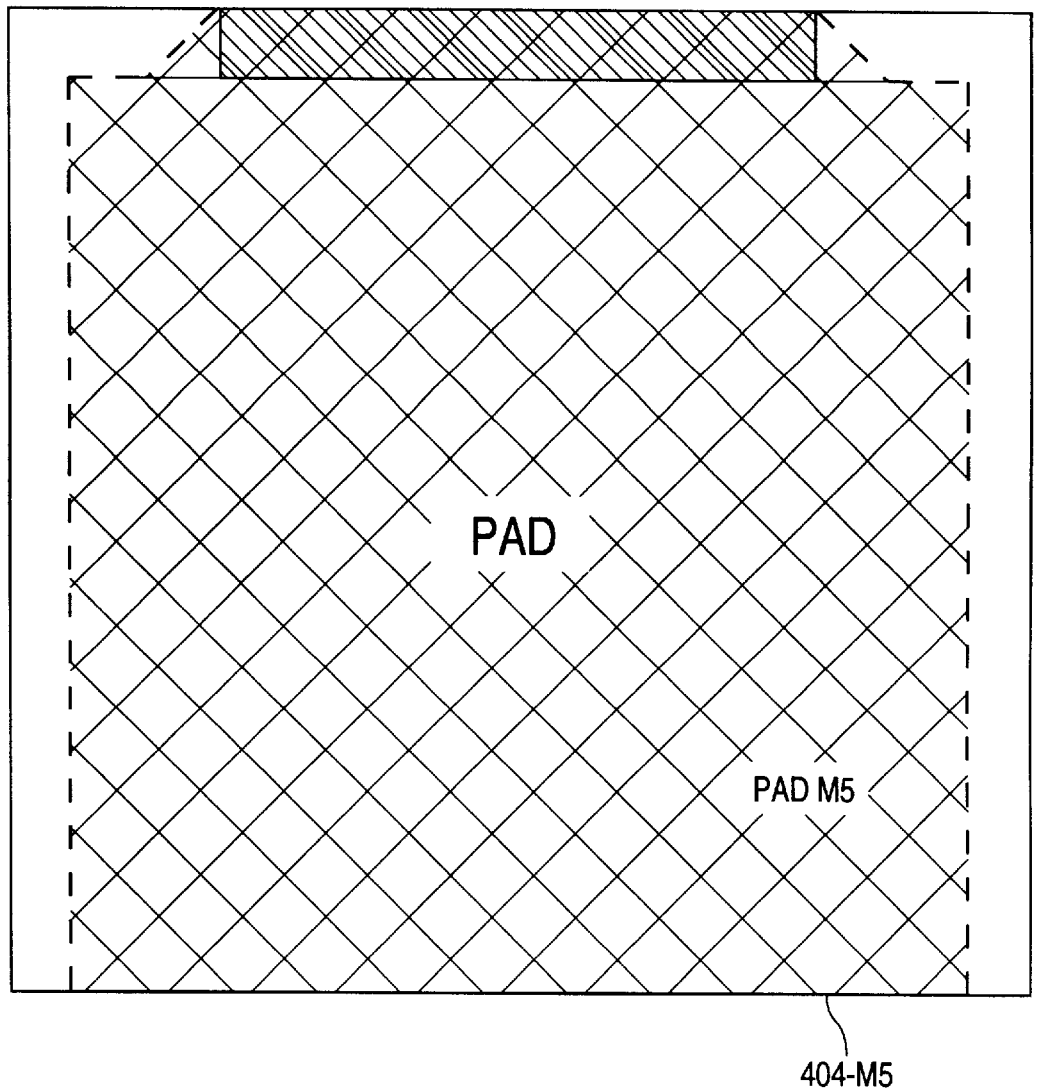

Referring to FIG. 8E, a pad 404 is formed from a third layer of metal (metal-3) to form a pad 404-M3. Pad 404-M3 makes electrical connections with a number of the vias 830 that are electrically connected to the anode of diode D1, and the cathode of diode D2. Circuit 424 further includes metal traces 832A and 832B that make electrical connections with vias 830 that are connected to trace T10A and T10B, respectively. Traces 832A and 832B are formed from metal-3 layer.

Circuit 424 additionally includes a number of vias 850 that are formed through a fourth layer of dielectric material (formed on the third layer of dielectric material and the metal-3 traces and pad) to make electrical connections with pad 404-M3. (The number and placement of vias 850 are merely illustrative, and are not intended to limit the present invention.)

Referring to FIG. 8F, pad 404 is again formed from a fourth layer of metal (metal-4) to form pad 404-M4. Pad 404-M4 makes electrical connections with the vias 850 (shown as dashed boxes) that are electrically connected to pad 404-M3. Further, circuit 424 includes a number of vias 852 that are formed through a fifth layer of dielectric material to make electrical connections with pad 404-M4. (The number and placement of vias 852 are merely illustrative, and are not intended to limit the present invention.) The fifth layer of dielectric material is formed on the fourth layer of dielectric material and the pad.

Referring to FIG. 8G, pad 404 is again formed from a fifth layer of metal (M5) to form a pad 404-M5. (Although the present invention has been described in terms of five metal layers, the present invention applies to processes that use four or more metal layers. In the case of four metal layers, metal layers M3 and M4 form the PAD metal.) Pad 404-M5 makes electrical connections with a number of the vias 852 that are electrically connected to pad 404-M4.

The vias are staggered so that a via connected to a metal layer is not vertically aligned with another via connected to the metal layer. The staggering decouples mechanical stress from propagating down to the underlying layers. When vias are stacked (not staggered), the vias form a pillar. When force is applied to the surface of the pad by, for example, wire bond or wafer probe, the force can be transmitted down to the surface of the semiconductor die.

Thus, in accordance with the present invention, the ESD plus and minus rings 410 and 412 are formed below the metal-3 through metal-5 layers that are used to form pad 404. As a result, one advantage of the present invention is that the present invention substantially reduces the size of the I/O cell height and the size of the die.

As noted above, the cell height of a prior art I/O cell is defined by the size requirements of the pad, the pair of ESD plus and minus rings, the pair of clean power and ground rings, and the pair of dirty power and ground rings. However, by placing the ESD plus and minus rings 410 and 412 below pads 404-M3, 404-M4, and 404-M5, the I/O cell height is reduced by about 25%. Experimental results have indicated a saving of three mils in I/O cell height which, since I/O cells are formed on both sides of the die, reduces the width of the die by approximately six mils.

Another advantage of the present invention is that, since the ESD diodes are located directly under pads 404-M3, 404-M4, and 404-M5, a much shorter path exists between the diodes and the pads. Thus, metal resistance is minimized, thereby reducing the IR drop across the path during an ESD event. In addition, since the slave clamp circuits are located right next to the ESD diodes under the pad, metal resistance is again minimized.

Thus, the present invention provides significant improvements in the in I/O cell size, and the maximum ESD current ($I_{ZAP}$) that a semiconductor chip can withstand.

It should be understood that the above descriptions are examples of the present invention, and various alternatives to the embodiments of the invention described herein may be employed in practicing the invention. It is intended that the following claims define the scope of the invention and that structures and methods within the scope of these claims and their equivalents be covered thereby.

What is claimed is:

1. An electrostatic discharge (ESD) protection circuit formed on a semiconductor die, the die having a periphery, the ESD protection circuit comprising:
   an ESD plus ring formed on the die around the periphery of the die;
   an ESD minus ring formed on the die around the periphery of the die;
   a first trigger ring formed on the die around the periphery of the die;
   a second trigger ring formed on the die around the periphery of the die; and
   a plurality of first clamps formed on the die, each first clamp having:
      a first diode formed on the die, the first diode being connected to a pad and the ESD plus ring;
      a second diode formed on the die, the second diode being connected to the pad and the ESD minus ring;
      a first transistor connected to the ESD plus ring, the first trigger ring, and a first node;
      a second transistor connected to the first node, the second trigger ring, and a second node;
      a third transistor connected to the ESD minus ring, the second trigger ring, and the second node;
      a fourth transistor connected to the ESD plus ring, the first node, and a third node; and
      a fifth transistor connected to the second node, the third node, and the ESD minus ring.

2. The ESD protection circuit of claim 1 and further comprising a plurality of second clamps, each second clamp having:
   a timing circuit connected to the ESD plus ring and the ESD minus ring, the timing circuit controlling a voltage on a fourth node and a voltage on a fifth node;
   a sixth transistor connected to the ESD plus ring, the first trigger ring, and a sixth node, the sixth transistor responding to the voltage on the fourth node;
   a seventh transistor connected to the sixth node and a seventh node, the seventh transistor responding to the voltage on the fifth node;
   an eighth transistor connected to the ESD minus ring and the seventh node, the eighth transistor responding to the voltage on the fifth node;
   a ninth transistor connected to the ESD plus ring, the sixth node, and an eighth node; and
   a tenth transistor connected to the seventh node, the eighth node, and the ESD minus ring.

3. The ESD protection circuit of claim 2 wherein the first transistor and the sixth transistor turn on when a voltage on the ESD plus ring is greater than the voltage on the second node by a predetermined amount.

4. The ESD protection circuit of claim 3 wherein the fourth transistor turns on when the voltage on the ESD plus ring is greater than the voltage on the first trigger ring by a predetermined amount.

5. The ESD protection circuit of claim 4 and further comprising a resistor connected to the ESD plus ring and the first trigger ring.

6. The ESD protection circuit of claim 1 wherein each pad has a corresponding first clamp.

7. The ESD protection circuit of claim 1 wherein the first diode is formed on the semiconductor die;
   the second diode is formed on the semiconductor die spaced apart from the first diode;
   the ESD plus ring is formed over the first diode;
   the ESD minus ring is formed over the second diode; and
   a pad is formed over the ESD plus ring.

8. The ESD protection circuit of claim 7 wherein the pad is formed over the ESD minus ring.

9. The ESD protection circuit of claim 8 wherein:
   the fourth and fifth transistors are formed on the semiconductor die;
   the ESD plus ring is formed over and electrically connected to the fourth transistor; and
   the ESD minus ring is formed over and electrically connected to the fifth transistor.

10. The ESD protection circuit of claim 9 wherein:
    the first transistor is formed on the semiconductor die; and
    the ESD plus ring is formed over and electrically connected to the first transistor.

11. The ESD protection circuit of claim 10 wherein:
    the third transistor is formed on the semiconductor die; and
    the ESD minus ring is formed over and electrically connected to the third transistor.

12. The ESD protection circuit of claim 9 wherein:
    the fifth transistor is formed on the semiconductor die; and
    the ESD minus ring is formed over and electrically connected to the fifth transistor.

13. The ESD protection circuit of claim 7 wherein the pad formed over the ESD plus ring is electrically connected to the first diode.

14. The ESD protection circuit of claim 13 wherein the pad is formed over the ESD minus ring and electrically connected to the second diode.

15. The ESD protection circuit of claim 1 wherein the pad has three or more metal layers.

16. The ESD protection circuit of claim 15 wherein
 each metal layer of the pad is connected to a vertically adjacent metal layer of the pad by vias; and
 the vias are staggered so that a via connected to a metal layer is vertically aligned with another via connected to the metal layer.

17. The ESD protection circuit of claim 1 wherein the ESD minus ring is formed over a portion of the trigger ring.

18. The ESD protection circuit of claim 1 and further comprising a plurality of second clamps, each second clamp having:
 a clamp circuit connected to the ESD plus ring and the ESD minus ring, the clamp circuit having:
  a timing circuit, the timing circuit having a resistive element connected to the ESD plus ring and a fourth node;
  a pre-driver circuit connected to the timing circuit, the pre-driver circuit including a first transistor connected to the ESD plus ring, the first transistor turning on when a difference between a voltage on the ESD plus ring and a voltage on the first trigger ring exceeds a predetermined amount; and
  a switching circuit connected to the pre-driver circuit, the ESD plus ring, and the ESD minus ring; and
 a keep off circuit connected to the clamp circuit, the keep off circuit having:
  a control circuit connected to the fourth node and a shield node, the control circuit having an output; and
  a keep off transistor connected to the ESD plus ring, the fourth node, and the output of the control circuit, the keep off transistor providing a current path from the ESD plus ring to the fourth node when turned on.

19. The ESD protection circuit of claim 18 wherein:
 the ESD plus ring has a steady first voltage, and can be driven to a larger second voltage, and
 the keep off transistor sources a current into the fourth node when the voltage on the ESD plus ring changes from the first voltage to the second voltage, the current having a magnitude that prevents the difference from exceeding the predetermined amount.

20. The ESD protection circuit of claim 19 wherein when a voltage on the ESD plus ring spikes up to a third voltage that is substantially greater than the second voltage, the keep off transistor is turned off.

* * * * *

UNITED STATES PATENT AND TRADEMARK OFFICE
CERTIFICATE OF CORRECTION

PATENT NO. : 6,621,680 B1  
DATED : September 16, 2003  
INVENTOR(S) : Alan Erik Segervall It is certified that error appears in the above-identified patent and that said Letters Patent is hereby corrected as shown below:

Column 6,  
Line 26, delete "SA" and replace with -- 5A --.

Column 7,  
Line 25, delete "MS" and replace with -- M5 --.

Signed and Sealed this

Twenty-first Day of October, 2003

JAMES E. ROGAN  
*Director of the United States Patent and Trademark Office*